(12) United States Patent
Ismail et al.

(10) Patent No.: US 6,460,165 B1
(45) Date of Patent: Oct. 1, 2002

(54) MODEL FOR SIMULATING TREE STRUCTURED VLSI INTERCONNECT

(75) Inventors: Yehea Ismail; Eby G. Friedman, both of Rochester, NY (US)

(73) Assignee: University of Rochester, Rochester, NY (US)

(*) Notice: Subject to any disclaimer, the term of this patent is extended or adjusted under 35 U.S.C. 154(b) by 0 days.

(21) Appl. No.: 09/521,178

(22) Filed: Mar. 8, 2000

Related U.S. Application Data

(60) Provisional application No. 60/139,575, filed on Jun. 17, 1999.

(51) Int. Cl.[7] .............................................. G06F 17/50
(52) U.S. Cl. .................................. 716/1; 716/6; 716/18
(58) Field of Search ................................ 716/1, 4, 5, 6, 716/7, 2, 18, 10; 703/2, 14, 13, 15, 16, 19; 327/552, 553, 554, 555, 556, 557, 558, 559

(56) References Cited

U.S. PATENT DOCUMENTS

| | | | |
|---|---|---|---|
| 6,009,248 A | * 12/1999 | Sato et al. | 716/10 |
| 6,088,523 A | * 7/2000 | Nabors et al. | 703/14 |
| 6,229,861 B1 | * 5/2001 | Young | 375/356 |
| 6,298,046 B1 | * 10/2001 | Thiele | 370/282 |
| 6,314,546 B1 | * 11/2001 | Muddu | 716/5 |

OTHER PUBLICATIONS

Ismail, Y. et al., Signal Waveform Characterization In Rlc Trees, Iscas 99, vol. 6, pp. 190–193.
Ismail, Y. et al., Inductance Effects in RCL Trees, Proceedings Ninth Great Lakes Symposium on VLSI, Mar. 1999, Ypsilanti, MI, USA, pp.56–59.

* cited by examiner

*Primary Examiner*—Matthew Smith
*Assistant Examiner*—Paul Dinh
(74) *Attorney, Agent, or Firm*—Blank Rome Comisky & McCauley LLP

(57) ABSTRACT

Transfer functions are calculated in the following manner within an RLC tree having a input and a plurality of nodes. The RLC tree is divided into left and right sub-trees joined by the node closest to the input. Each of the left and right sub-trees is divided into left and right sub-trees joined by a node. The sub-trees are divided recursively into still smaller sub-trees until the RLC tree is completely decomposed into left and right sub-trees joined by nodes. At each node of the RLC tree, the numerator and denominator of the transfer function at that node are determined in accordance with the left and right sub-trees joined by that node. The denominator of the transfer function of the node closest to the input is taken to be the denominator of all of the transfer functions of the RLC tree. For each node, the numerators of the transfer functions of the left and right sub-trees joined at that node are corrected in accordance with the denominators of the transfer functions of the left and right sub-trees joined at that node.

28 Claims, 15 Drawing Sheets

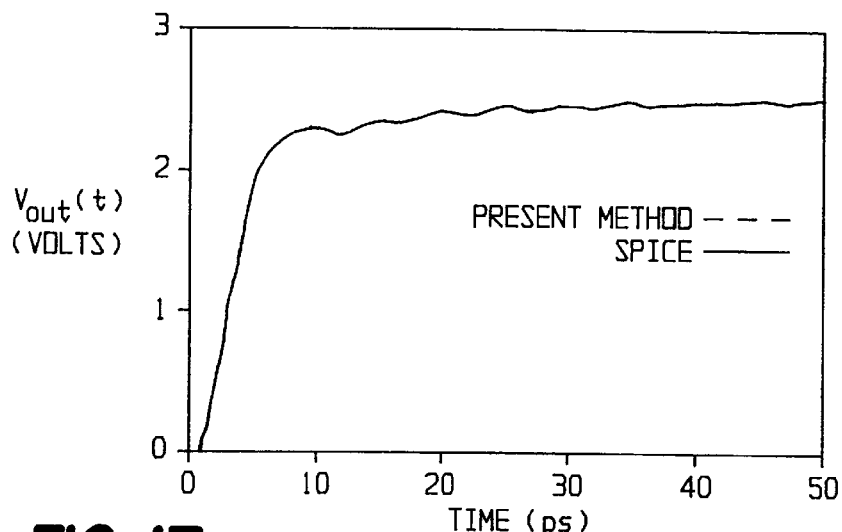

```
CAL_DENOMINATOR (SECTION*w)
{
  IF(RIGHT(w)=0)         /* THERE IS NO RIGHT SECTION DRIVEN BY w */
      (D_r=1; M_r=0;)
  ELSE                   /* THERE IS A RIGHT SECTION DRIVEN BY w */
      (CAL_DENOMINATOR(RIGHT(w)); D_r=RIGHT(w)->D; M_r=RIGHT(W)->M;)

IF(LEFT(w)=0)          /* THERE IS NO RIGHT SECTION DRIVEN BY w */
      (D_L=1; M_L=0;)
  ELSE                   /* THERE IS A RIGHT SECTION DRIVEN BY w */
      (CAL_DENOMINATOR(LEFT(w)); D_L=LEFTt(w)->D; M_L=LEFTt(w)->M;)

w->N = D_L*D_r;
  W->M = w->C*w->N +M_L*D_r + M_r*D_L;
  w->D = w->B + (w->M)*[(w->R)*s+(w->L)*s^2];
}
```

```
CORRECT_NUMERATORS(SECTION *w, POLY F_in)
{
        IF(RIGHT(w)≠0)        /* w DRIVES A RIGHT SECTION */
            (F_r= F_in•D_r; CORRECT_NUMERATOR(RIGHT(w), F_r);)

IF(LEFT(w)≠0)         /* w DRIVES A LEFT SECTION */
            (F_L= F_in•D_L; CORRECT_NUMERATOR(LEFT(w), F_L);)

w->N = w->N•F_in;
}
```

MODEL FOR SIMULATING TREE STRUCTURED VLSI INTERCONNECT

REFERENCE TO RELATED APPLICATION

This application claims the benefit of U.S. provisional application No. 60/139,575, filed Jun. 17, 1999, whose disclosure is hereby incorporated by reference in its entirety into the present disclosure.

BACKGROUND OF THE INVENTION

The present invention is directed to a method of simulating an RLC tree and more particularly to a method of evaluating time domain signals within an RLC tree with arbitrary accuracy in response to any input signal.

In circuit design, fast, accurate computer simulation of the behavior of the circuit is important. That is especially true with VLSI, in which hundreds of thousands of circuit elements can be placed on a single chip, and with ULSI, in which millions of circuit elements can be placed on a single chip.

It has become well accepted that interconnect delay dominates gate delay in current deep submicrometer VLSI circuits. With the continuous scaling of technology and increased die area, that situation is becoming worse. In order to design complex circuits properly, accurate characterization of the interconnect behavior and signal transients is required. An interconnect in a VLSI circuit is commonly tree structured. A single line is a special case of a tree that has only one output (or sink). Thus, the process of characterizing signal waveforms in tree structured interconnect is of primary importance.

One of the more popular delay models used within industry for RC trees is the Elmore delay model. Recently, an equivalent to the Elmore delay model has been introduced for RLC trees. Those models are used for fast approximate delay estimation. However, highly accurate estimation of signal transients within a VLSI circuit is required for performance-critical modules and nets and to accurately anticipate possible hazards during switching. Also, the increasing performance requirements forces the reduction of the safety margins used in a worst case design, requiring a more accurate delay characterization.

AWE (Asymptotic Waveform Evaluation) based algorithms have gained popularity as providing a more accurate delay model than the Elmore delay model. AWE uses moment matching to find a set of low frequency dominant poles that approximate the transient response at the nodes of an RLC tree. However, AWE suffers two major problems. The first problem is that the AWE method can lead to an approximation with unstable poles even for low order approximations. The second problem is that AWE becomes numerically unstable for higher order approximations, which limits the order of the approximations determined using AWE to fewer than eight poles, of which some poles may be unstable and have to be discarded. The limited number of poles is inappropriate to evaluate the transient response at the nodes of an underdamped RLC tree, which requires a much higher number of poles to accurately capture the transient response at all the nodes.

To overcome this limitation, a set of model order reduction algorithms have been developed to determine higher order approximations appropriate for RLC circuits based on the state space representation of an RLC network. However, these model order reduction techniques have significantly higher computational complexity than AWE. These techniques have super linear complexity with the order of the RLC tree, which is equal to the total number of capacitors and inductors in the tree. This high complexity is because these model order reduction techniques have to solve n linear equations in n variables several times. This complexity is much higher than the complexity of AWE, which is linearly proportional to n for an RLC tree. Note that n can be in the order of thousands for a typical large industrial net.

SUMMARY OF THE INVENTION

In light of the above, it will be apparent that a need exists in the art for a circuit analysis method and system which can accurately capture the transient responses at all nodes in a computationally efficient manner.

It is therefore a primary object of the invention to provide a method and system for evaluating the transient response at all of the nodes of a general RLC tree using high order approximations.

It is another object of the invention to provide such a method and system which can do so in a computationally efficient manner.

It is yet another object of the invention to provide such a method and system having a high degree of stability in terms of both numerical stability and pole stability.

To achieve the above and other objects, the present invention is directed to a method and system for evaluating the transient response at the nodes of a general RLC tree, the method and system being capable of determining high order approximations appropriate for underdamped RLC trees in a computationally efficient way (complexity linear with n). The present invention also has improved stability properties for low order approximations as compared to AWE, which can be a useful feature with RC trees which do not require high order approximations.

The method and system operate as follows. The RLC tree is divided into left and right sub-trees joined by the node closest to the input. Each of the left and right sub-trees is divided into left and right sub-trees joined by a node. The sub-trees are divided recursively into still smaller sub-trees until the RLC tree is completely decomposed into left and right sub-trees joined by nodes. At each node of the RLC tree, the numerator and denominator of the transfer function at that node are determined in accordance with the left and right sub-trees joined by the node. The denominator of the transfer function of the node closest to the input is taken to be the denominator of all of the transfer functions of the RLC tree. For each node, the numerators of the transfer functions of the left and right sub-trees joined at the node are corrected in accordance with the denominators of the transfer functions of the left and right sub-trees joined at that node.

The present invention evaluates the time domain signals within RLC trees with arbitrary accuracy in response to any input signal. It does so by finding a low frequency reduced order transfer function by direct truncation of the exact transfer function at different nodes of an RLC tree. The method is numerically accurate for any order of approximation, which allows finding approximations with large numbers of poles appropriate for approximating RLC trees with underdamped responses. The method is computationally efficient with a complexity linearly proportional to the number of branches in an RLC tree. The method determines a common set of poles to characterize the responses at all the nodes of an RLC tree, which enhances the computational efficiency of the proposed method. The stability is guaranteed for low order approximations with fewer than 5 poles. Such low order approximations are useful for evaluating monotone responses exhibited by RC circuits.

BRIEF DESCRIPTION OF THE DRAWINGS

A preferred embodiment of the present invention will be set forth in detail with reference to the drawings, in which:

FIG. 17 shows the transient response evaluated at a node of a large copper interconnect RLC for a $45^{th}$ approximation order;

FIG. 18 shows pseudo-code for calculating the common denominator of an RLC tree;

DETAILED DESCRIPTION OF THE PREFERRED EMBODIMENTS

A preferred embodiment of the present invention will now be set forth in detail with reference to the drawings. The rules governing the poles and zeros in an RLC tree are defined in subsection A. The method used to calculate the exact transfer functions at the nodes of an RLC tree is introduced in subsection B. The use of transfer function truncation to determine a reduced order approximation is discussed in subsection C. The determination of the set of common poles describing the transient response of an RLC tree and the corresponding residues at each node of the tree is described in subsection D. The stability and complexity characteristics of the method are described in subsection E. Finally experimental results are given in subsection F.

A. Pole-Zero Behavior in RLC Trees E

The poles and zeros of an RLC tree maintain specific relations to the poles and zeros of sub-trees forming the RLC tree. These rules are established in this subsection and are used in the next subsection to develop an algorithm to determine the poles and zeros of a general RLC tree by recursively subdividing the tree into small sub-trees.

Rule 1: The Poles of an RLC Circuit are Zeros of the Impedance Seen at the Input of the Circuit.

Figure 1:
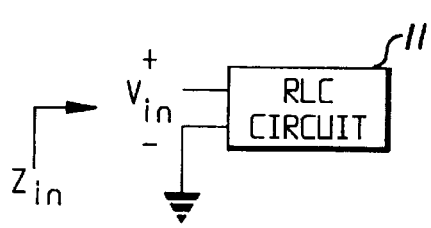
FIG. 1 shows a simplified block diagram of a general RLC circuit.

This rule can be understood by referring to FIG. 1 which allows a general RLC circuit 11, and noting that the transfer functions describing the capacitor voltages and inductor currents have a common denominator.

Thus, the transfer function at an arbitrary node i of an RLC tree and the tree's input admittance are given by $$\frac{V_i(s)}{V_{in}(s)} = \frac{N_i(s)}{D(s)} \qquad (1)$$

$$Y_{in}(s) = \frac{I_{in}(s)}{V_{in}(s)} = \frac{N_{I_{in}}(s)}{D(s)} \qquad (2)$$

respectively, where $N_i(s)$ and $N_{I_{in}}(s)$ are functions of s dependent on the circuit structure and $D(s)$ is the common denominator of the circuit. The input impedance is $$Z_{in}(s) = \frac{V_{in}(s)}{I_{in}(s)} = \frac{D(s)}{N_{I_{in}}(s)} \qquad (3)$$

Thus, the common denominator of an RLC circuit is the numerator of the input impedance, which proves rule 1.

Figure 2:
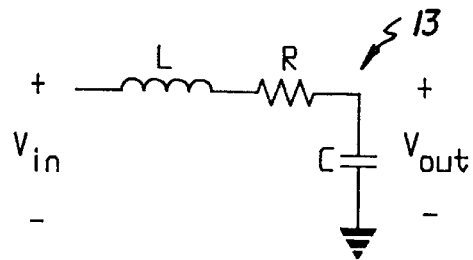
FIG. 2 shows an example of a single-section RLC circuit.

As an example, consider the single section RLC circuit 13 in FIG. 2. This circuit has a transfer function and an input impedance given by $$\frac{V_{out}(s)}{V_{in}(s)} = \frac{1}{s^2 LC + sRC + 1} \qquad (4)$$

$$\frac{V_{in}(s)}{I_{in}(s)} = sL + R + \frac{1}{sC} = \frac{s^2 LC + sRC + 1}{sC} \qquad (5)$$

respectively. The denominator of the transfer function is the numerator of the input impedance. Rule 1 means that an RLC circuit has a short-circuit input impedance when s is equal to any of the poles of the circuit.

Rule 2: The Poles of an RLC Circuit Driven at Node x are Zeros of the Transfer Function at Node x.

Figure 3:
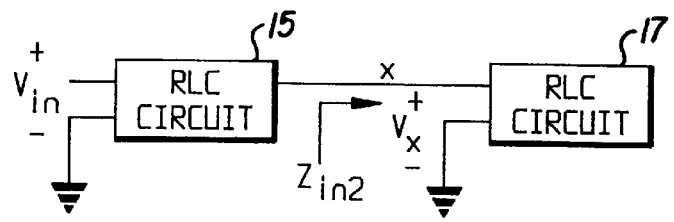
FIG. 3 shows a general RLC circuit formed of two RLC subcircuits connected together.

This rule can be explained by referring to FIG. 3. Note that the RLC circuit 17 is driven by the RLC circuit 15 at node x. Applying rule 1, $Z_{in2}$ is a short circuit between node x and the ground at frequencies equal to the poles of circuit 17. Hence $V_x(s)$ is equal to zero when s is equal to the poles of circuit 17, i.e., the poles of circuit 17 are zeros of the transfer function at node x.

Figure 4:
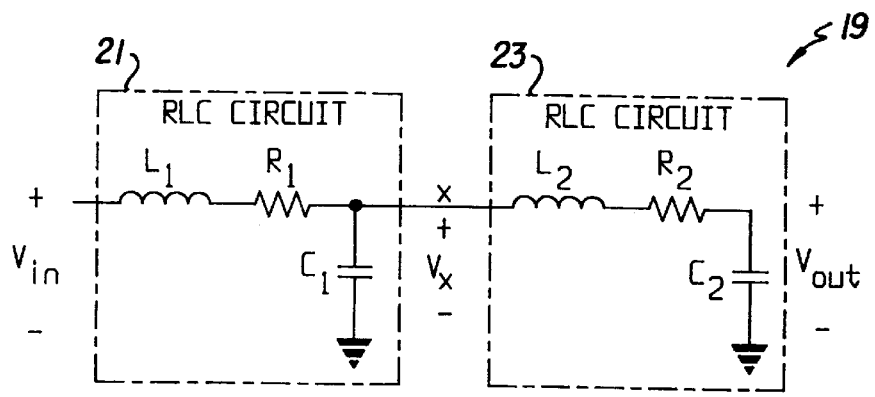
FIG. 4 shows a ladder RLC circuit formed of two RLC sections in series.

As an example, consider the circuit 19 in FIG. 4. Note that the RLC sub-circuit 23 is driven at node x by the RLC sub-circuit 21 and that if not connected, sub-circuit 23 has a denominator given by $1+R_2C_2s+L_2C_2s^2$. The transfer functions at node x and the output node are $$\frac{V_x(s)}{V_{in}(s)} = \frac{1 + R_2C_2s + L_2C_2s^2}{1 + [R_1(C_1 + C_2) + R_2C_2]s + [L_1(C_1 + C_2) + L_2C_2 + R_1C_1R_2C_2]s^2 + [R_1C_1L_2C_2 + R_2C_2L_1C_1]s^3 + [L_1C_1L_2C_2]s^4} \quad (6)$$

$$\frac{V_{out}(s)}{V_{in}(s)} = \frac{1}{1 + [R_1(C_1 + C_2) + R_2C_2]s + [L_1(C_1 + C_2) + L_2C_2 + R_1C_1R_2C_2]s^2 + [R_1C_1L_2C_2 + R_2C_2L_1C_1]s^3 + [L_1C_1L_2C_2]s^4} \quad (7)$$

respectively. Note that the numerator at node x is the same as the denominator of the disconnected sub-circuit 23 in accordance with rule 2.

Rule 3: The Poles of an RLC Circuit Driven at Node x are Zeros of the Transfer Functions at All the Nodes of Parallel RLC Circuits Driven at the Same Node x.

Figure 5:
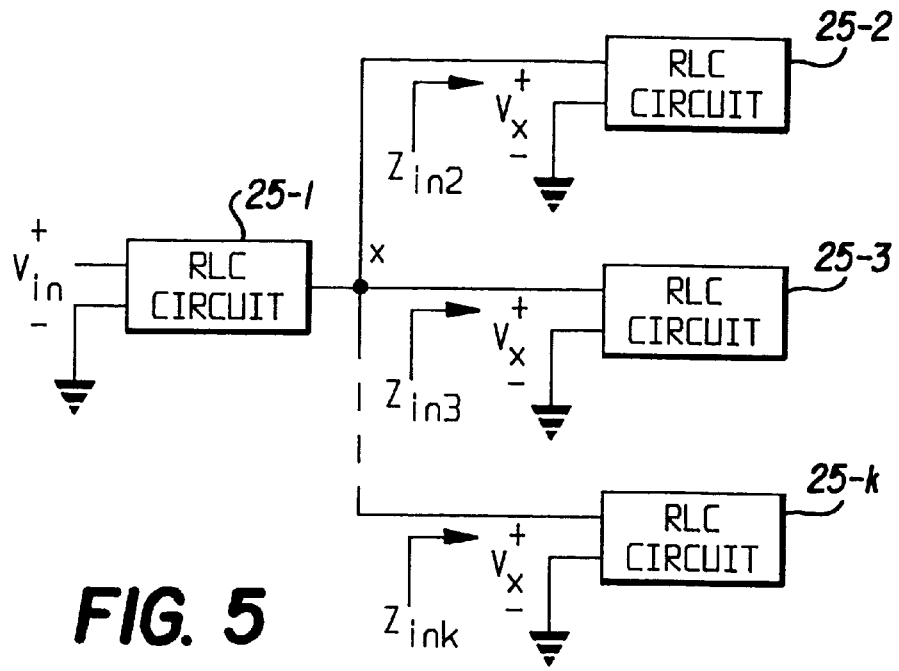
FIG. 5 shows a general RLC circuit formed of an RLC subcircuit driving several additional RLC subcircuits which are connected together in parallel.

This rule can be explained by referring to FIG. 5. The RLC sub-circuits 25-2,25-3, . . . 25-k are driven by RLC sub-circuit 25-1 at node x. Applying rule 1, $Z_{in2}$ is a short-circuit at frequencies equal to the poles of circuit 25-2. Hence, $V_x(s)$ is equal to zero and all the current supplied by circuit 25-1 is sunk to ground by $Z_{in2}$ when s is equal to the poles of circuit 25-2. Since $V_x(s)$ is equal to zero and no current is supplied to the sub-circuits 25-3, . . . , 25-k when s is equal to the poles of circuit 25-2, the voltages at all the nodes of sub-circuits 25-3, . . . , 25-k are equal to zero. Alternatively, the poles of circuit 25-2 are zeros of the transfer functions at all the nodes of the parallel sub-circuits driven at node x. The same is true for the poles of sub-circuits 25-3, . . . 25-k which are zeros of the transfer functions at all the nodes of the parallel sub-circuits driven at node x.

Figure 6:
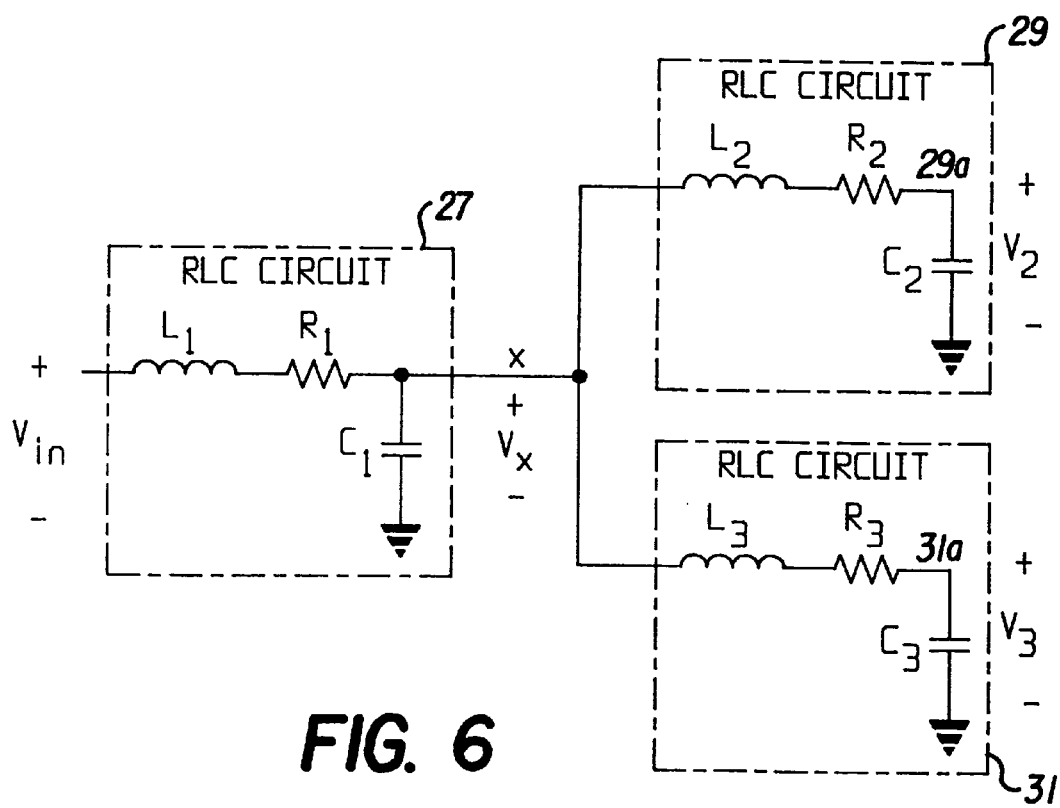
FIG. 6 shows an RLC tree formed of three RLC sections.

As an example, consider the RLC tree in FIG. 6. The RLC section 27 drives the two-parallel RLC sections 29 and 31. The transfer functions at nodes x, 29a and 31a are given by $$\frac{V_x(s)}{V_{in}(s)} = \frac{(1 + R_2C_2s + L_2C_2s^2)(1 + R_3C_3s + L_3C_3s^2)}{D} \quad (8)$$

$$\frac{V_2(s)}{V_{in}(s)} = \frac{(1 + R_3C_3s + L_3C_3s^2)}{D} \quad (9)$$

$$\frac{V_3(s)}{V_{in}(s)} = \frac{(1 + R_2C_2s + L_2C_2s^2)}{D} \quad (10)$$

respectively, where D is the common denominator and is a polynomial in s of order six. The specific form of D is not of interest here. The denominators of sub-circuits 29 and 31 are $1+R_2C_2s+L_2C^2s^2$, and $1+R_3C_3s+L_3C_3s^2$, respectively. Note that both denominators are in the numerator of the transfer function at node x showing that the poles of sub-circuits 29 and 31 are zeros of the transfer function at the driving node x in accordance with rule 2. Note also that the poles of sub-circuit 29 are zeros of the transfer function at node 31 and vice versa which verifies rule 3.

B. Calculating the Transfer Functions at the Nodes of an RLC Tree

Figure 7:
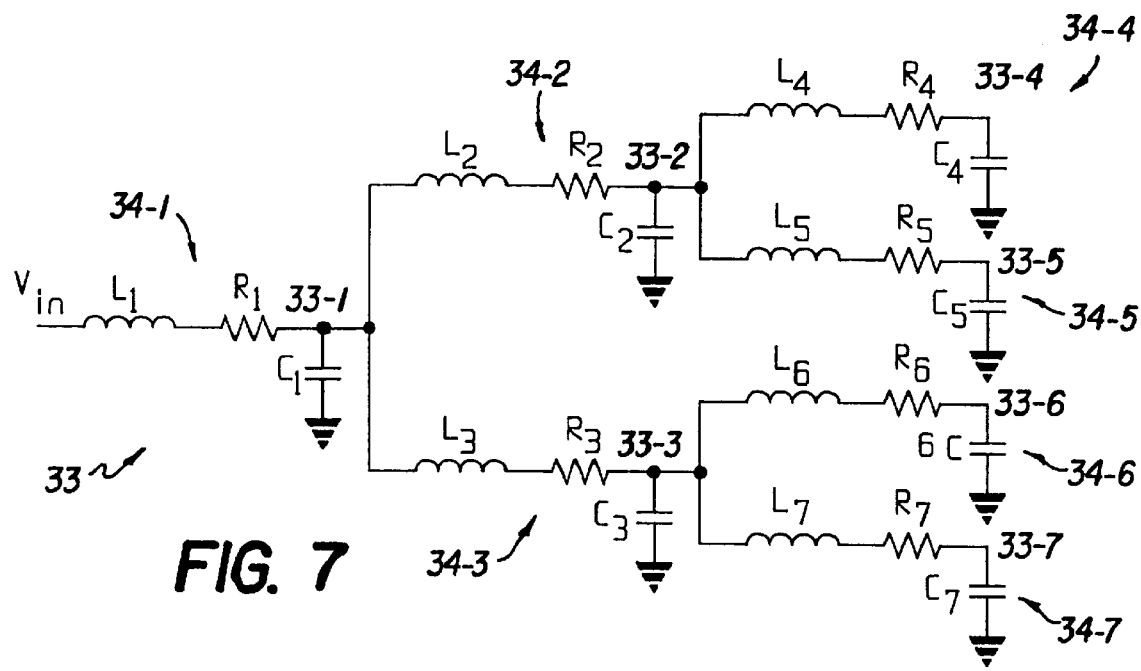
FIG. 7 shows a general RLC tree.

It is illustrated in this subsection how to recursively calculate the transfer functions at the nodes of an RLC tree using the concepts developed in the previous subsection. Consider the general RLC tree 33 in FIG. 7. The current sunk to ground by a capacitor k is given by $C_k dv_k(t)/dt$ where $v_k(t)$ is the voltage across $C_k$. Thus, the current passing through the resistance $R_1$ and the inductance $L_1$ is given by $$i_1(t) = \sum_k C_k \frac{dv_k(t)}{dt} \quad (11)$$

where the summation index k runs over all the capacitors in the tree. The voltage drop across $R_1$ and $L_1$ is given by $$v_{in}(t) - v_1(t) = \quad (12)$$

$$R_1 i_1(t) + L_1 \frac{di_1(t)}{dt} = R_1 \sum_k C_k \frac{dv_k(t)}{dt} + L_1 \sum_k C_k \frac{d^2 v_k(t)}{dt^2}$$

In the frequency domain the above relations transforms to $$V_{in}(s) - V_1(s) = (sR_1 + s^2L_1) \sum_k C_k V_k(s) \quad (13)$$

Dividing (13) by $V_{in}(s)$ in the following:

$$1 - T_1(s) = (sR_1 + s^2L_1) \sum_k C_k T_k(s) \quad (14)$$

where $T_1(s)$ is the transfer function at node 33-1 and $T_k(s)$ is the transfer function at node k. Note that determining the transfer function at node 33-1 is sufficient to determine the poles of the circuit since the transfer functions at all the nodes 33-1, 33-2, 33-3, 33-4, 33-5, 33-6, and 33-7 of the RLC tree have a common denominator as aforementioned.

Figure 8:
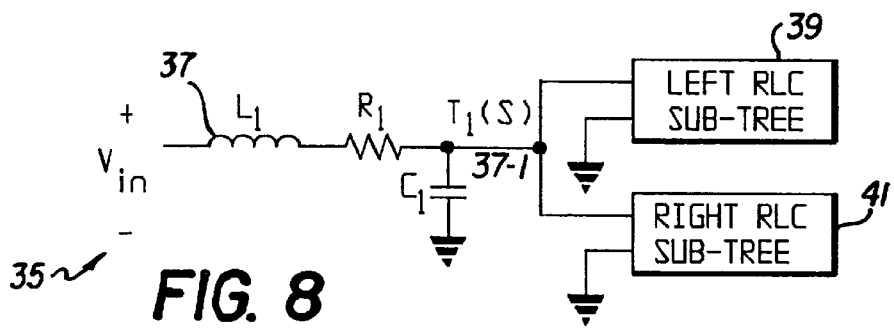
FIG. 8 shows a building block of a general RLC tree.

Now consider the structure 35 in FIG. 8 which shows an RLC section 37 driving left and right sub-trees 39 and 41. Without loss of generality, a binary branching factor is used, since a general tree with arbitrary branching factor can be transformed into a binary tree by inserting zero impedance branches. The structure in FIG. 8 can be used recursively to fully represent any RLC tree, since the left and right sub-trees can in turn be presented by the same structure. The transfer function at node 37-1 of FIG. 8 is given by equation (14), which can be reformulated by using the rational representations of the transfer functions $T_1(s)=N_1(s)/D(s)$ and $T_k(s)=N_k(s)/D(s)$ and is $$D(s) - N_1(s) = (sR + sL) \sum_k C_k N_k(s) \quad (15)$$

Assume that the transfer functions at all of the nodes of the left and right RLC sub-trees (when they are disconnected) are known and are given by $T_{lk1}(s)=N_{lk1}(s)/D_l(s)$ at node $k_1$ of the left sub-tree and $T_{rk2}(s)=N_{rk2}(s)/D_r(s)$ at node $k_2$ of the right sub-tree. The numerator at node 37-1, $N_1(s)$, of FIG. 8 can be directly calculated by applying rule 2 in the previous subsection and is $$N_1(s)=D_l(s) \cdot D_r(s) \quad (16)$$

The "·" operator above represents a polynomial multiplication. The denominator $D(s)$ can be determined from (15) as $$D(s)=N_1(s)+(sR_1+s^2L_1)M_1 \quad (17)$$

where $M_1$ is defined as $$M_1 = \sum_k C_k N_k(s) \tag{18}$$

and characterizes the summation of the numerators of the transfer functions across the capacitors in the tree multiplied by the corresponding capacitances. The summation in $M_1$ runs over all the capacitors in the tree and can be divided into three components as $$M_1 = C_1 N_1(s) + \sum_{k1} C_{k1} N_{k1}(s) + \sum_{k2} C_{k2} N_{k2}(s) \tag{19}$$

where $k_1$ covers the capacitors in the left sub-tree and $k_2$ covers the capacitors in the right sub-tree. By applying rule 3, the numerators in the left sub-tree can be described in terms of the parameters of the disconnected left and right sub-trees as $N_{k1}(s)=N_{lk1}(s) \cdot D_r(s)$. Similarly, $N_{k2}(s)=N_{rk2}(s) \cdot D_l(s)$. Thus, equation 19 can be put as $$M_1 = C_1 N_1(s) + \left( \sum_{k1} C_{k1} N_{lk1}(s) \right) \cdot D_r(s) + \left( \sum_{k2} C_{k2} N_{rk2}(s) \right) \cdot D_l(s) \tag{20}$$

Note that the two summations above are $M_l$ and $M_r$ of the disconnected left and right sub-trees, respectively. Hence, $M_1$ can be fully calculated in terms of the disconnected left and right sub-tree parameters as $$M_1 = C_1 N_1(s) + M_l(s) \cdot D_r(s) + M_r(s) \cdot D_l(s) \tag{21}$$

Thus, by knowing the parameters of the left and right sub-trees, $M_l(s)$, $D_l(s)$, $M_r(s)$, and $D_r(s)$, equations (16), (21) and (17) can be used in that order to find $N_1(s)$, $M_1(s)$, and $D(s)$, respectively. The parameters of the left and right sub-trees $M_l(s)$, $D_l(s)$, $M_r(s)$, and $D_r(s)$ can be determined in turn in terms of their left and right sub-trees by using the structure in FIG. 8 and equations (16), (21) and (17). This process is repeated recursively until the left and right sub-trees are non-existent. If the left sub-tree does not exist, then $M_l(s)=0$ and $D_l(s)=1$. If the right sub-tree does not exist, then $M_r(s)=0$ and $D_r(s)=1$.

After this recursion process terminates, the denominator and numerator across each capacitance $C_k$ in the tree represent the transfer function for the sub-tree rooted at the RLC section k. For example, for the tree in FIG. 7, D(s) and N(s) at node 33-1 represent the transfer function at node 33-1 for the entire tree. However, D(s) and N(s) at node 33-2 represent the transfer function at node 33-2 for the sub-tree composed of the RLC sections 34-2, 34-4 and 34-5.

Also, D(s) and N(s) at node 33-4 represent the transfer function at node 33-4 for the sub-tree composed of RLC section 34-4. Thus, after the recursion process terminates, the only relevant parameters to the entire RLC tree are D(s) and N(s) across the capacitor closest to the input ($C_1$ in the case of the tree in FIG. 7). The denominators and numerators at all other nodes are incorrect. The denominators at these nodes need not be corrected since they are the same as the denominator at the node closest to the input. However, the numerators differ at each node and need to be corrected. According to rule 3, all the numerators in the left sub-tree have to be multiplied by $D_r(s)$ and all the numerators in the right sub-tree have to be multiplied by $D_l(s)$. This process is repeated recursively starting at the root of the tree and advancing towards the sinks.

Thus, the process of determining the transfer function at all of the nodes of the RLC tree includes two steps. The first step is to calculate the common denominator of the RLC tree and is accomplished by the function Cal_Denominator, described below with reference to FIG. 18, which uses the recursive equations in (16), (21), and (17). The common denominator is the denominator at the node closest to the input of the RLC tree after the recursion terminates. The second step is to correct the numerators of the transfer functions at the nodes of the RLC tree. This task is achieved by the function Correct_Numerators, described below with reference to FIG. 19.

Figures 19, 20A:
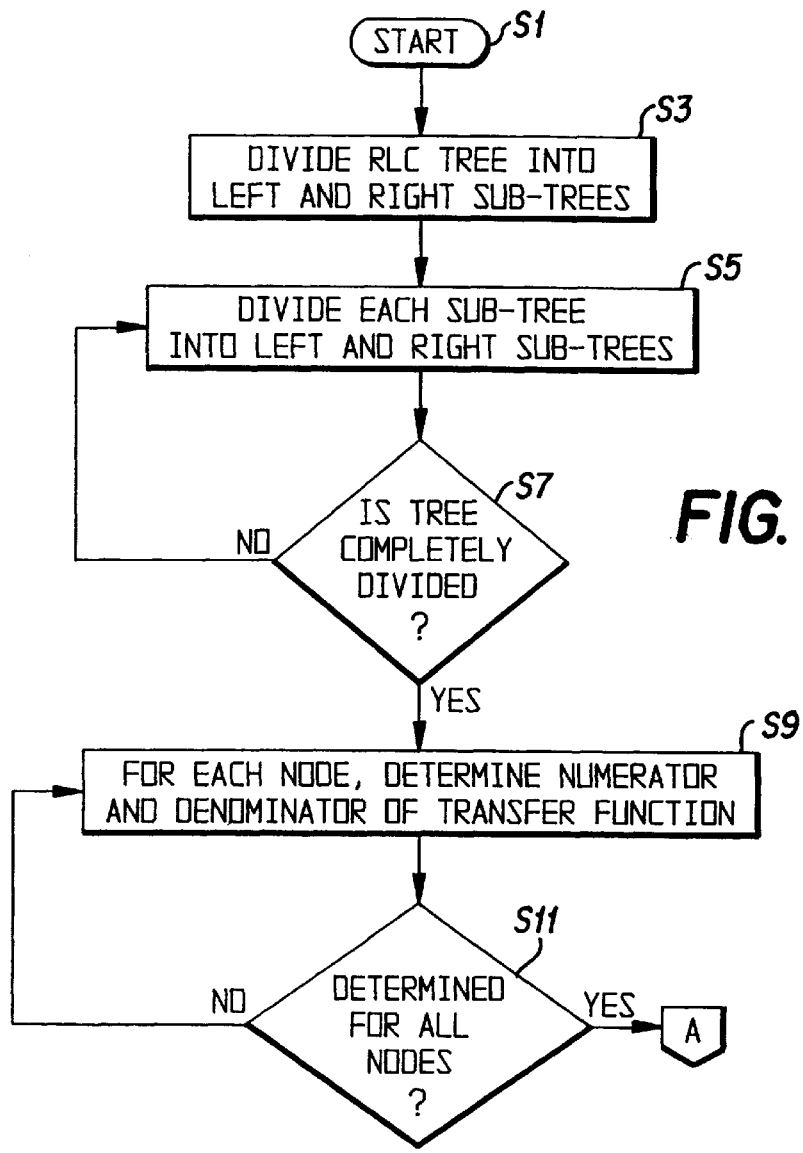
FIG. 19 shows pseudo-code for correcting the numerators of the transfer functions at all of the nodes of an RLC tree.
FIGS. 20A and 20B show a flow chart of the evaluation process according to the preferred embodiment of the present invention.
Figure 20B:
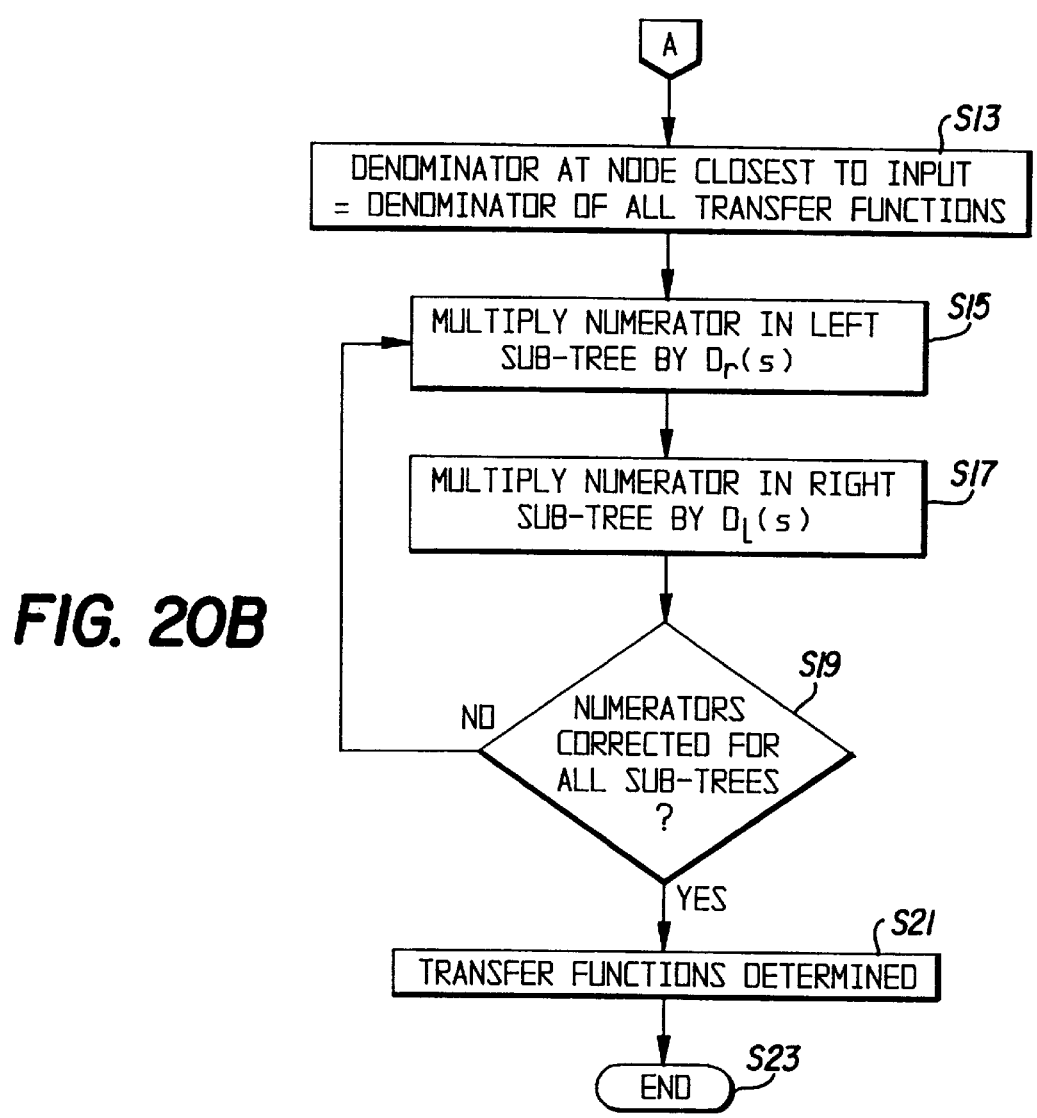

The recursive operation will be summarized with reference to the flow chart spanning FIGS. 20A and 20B. The operation starts in step S1. In step S3, the RLC tree is divided into left and right sub-trees. In step S5, each of those left and right sub-trees is further divided into left and right sub-trees. The division continues until it is determined in step S7 that the RLC tree is completely divided. In step S9, for each node, the numerator and denominator of the transfer function are determined as described above until it is determined in step S11 that the numerator and denominator are determined for all nodes. In step S13, the denominator at the node closest to the input is taken to be the denominator of all of the transfer functions. In steps S15 and S17, the numerators of the transfer functions are corrected. At each node, the numerator of the transfer function of the left sub-tree is multiplied by the denominator of the transfer function of the right sub-tree in step S15, and the numerator of the transfer function of the right sub-tree is multiplied by the denominator of the transfer function of the left sub-tree in step S17, until it is determined in step S19 that the numerators have been corrected for all sub-trees. Then, the transfer functions are determined in step S21 in the manner described above, and in step S23, the operation ends.

C. Transfer Function Truncation and Approximation Order

It has been shown how to calculate the exact transfer functions at all the nodes of an RLC tree in the previous subsection. However, calculating the exact transfer function can be time consuming since n can be in the order of thousands for typical large industrial RLC trees. In practice, there is no need to calculate the thousands of poles characterizing an RLC tree, since the transient behavior can be accurately characterized by a small number of dominant poles (typically several tens of poles). Dominant poles are low frequency poles (or poles with smaller magnitude). Thus, a low frequency approximation is required that can correctly anticipate the set of dominant poles without calculating the exact high order transfer function.

Assume that the exact transfer function at a specific node of the RLC tree is given by $$T(s) = \frac{1 + a_1 s + a_2 s^2 + \ldots + a_m s^m}{1 + b_1 s + b_2 s^2 + \ldots + b_n s^n} \tag{22}$$

where $b_1$–$b_n$ and $a_1$–$a_m$ are positive real constants. The system order n is equal to the total number of capacitors and inductors in the tree. The order of the numerator polynomial m is less than n and is dependent on the node at which the transfer function is calculated. A $q^{th}$ order approximate transfer function is found by direct truncation of the exact transfer function T(s) in equation (22) and is given by $$T_q(s) = \frac{1 + a_1 s + a_2 s^2 + \ldots + a_x s^x}{1 + b_1 s + b_2 s^2 + \ldots + b_q s^q} \quad (23)$$

where q<n. The numerator order x=m if m≦q−1; otherwise, x=q−1. The order of the numerator has to be less than the denominator order for a causal approximation. If s (or frequency) is small enough, the terms with higher power of s in the denominator and numerator polynomials ($b_{q+1}s^{q+1}$ – $b_n s^n$, $a_{x+1}s^{x+1}$ – $a_m s^m$) are negligible with respect to the lower power terms in $T_q(s)$. Thus, for low frequencies, $T_q(s)$ is an accurate representation of T(s). The range of frequencies for which $T_q(s)$ is accurate increases as q increases.

The calculation of a $q^{th}$ order approximation for the transfer functions at all the nodes of an RLC tree can be accomplished by an order limited polynomial multiplication. To understand the concept, assume that A and B are two polynomials of orders $n_a$ and $n_b$, respectively. The polynomial C is given by A·B and has an order of $n_c = n_a + n_b$. The polynomials A, B, C are given by $$A = \sum_{i=0}^{n_a} a_i s^i, \, B = \sum_{i=0}^{n_b} b_i s^i, \text{ and } C = \sum_{i=0}^{n_c} c_i s^i \quad (24)$$

where the coefficients $c_i$ are $$c_i = \sum_{j=0}^{n_a} a_j b_{i-j} \quad (25)$$

Note that $b_{i-j}$ is equal to zero if i−j is out of the range 0 to $n_b$. For a q limited polynomial multiplication, the highest power of s sought in C is q rather than $n_c$ and coefficients of higher powers of s needn't be calculated. Also, A and B can be q limited since higher powers than $s^q$ in both polynomials cannot produce powers of s in C less than or equal to q. Hence, if a $q^{th}$ order approximation is sought, all the polynomial multiplications of the method described in the previous subsection are q limited. These q limited polynomial multiplications are much less expensive in terms of computer time than full polynomial multiplications since q is typically much less than n. The number of scalar multiplications required for a q limited polynomial multiplication is at most q(q+1)/2 when the polynomial orders $n_a$ and $n_b$ are equal to q. As will be explained below, the actual number of scalar multiplications performed by the present method is much less than the number of multiplications anticipated using the q(q+1)/2 complexity of a polynomial multiplication.

D. Determining the Poles, Residues, and the Transient Response

Once the common denominator of order q, $D_q(s)$, is determined as described in the previous subsections, the first q dominant low frequency poles of the RLC tree can be calculated as the roots of the polynomial $D_q(s)$. A numerical method for finding the roots of a polynomial can be used to find he RLC tree poles $P_2$–$P_q$. The residues corresponding to each pole at the specific node can easily be calculated by direct substitution in the numerator of the transfer function at this node. The residues corresponding to the pole $p_i$ at node j of an RLC tree can be calculated as $$k_i^j = \frac{N_j(s = p_i)}{DP_i} \quad (26)$$

where $$DP_i = b_q \prod_{\substack{r=1 \\ r \neq i}}^{q} (p_i - p_r) \quad (27)$$

where $b_q$ is the coefficient of $s^q$ in $D_q(s)$. Note that $DP_i$ is independent of the node at which the residues are evaluated. Thus, $DP_i$ can be evaluated once and used to calculate the residues at any number of nodes, which reduces the computational complexity when the transient response is required at many nodes.

The poles of the circuit and the corresponding residues at node j of an RLC tree can be used to characterize the transfer function at node j as $$T_j(s) = \sum_{i=1}^{q} \frac{k_i^j}{(s - p_i)} \quad (28)$$

The above transfer function can be used to calculate the time domain response at node j for an arbitrary input by multiplying the Laplace transform of the input by $T_j(s)$ and calculating the inverse Laplace transform of the resulting expression. For example, for a unit step input, the output response at node j, $e_j(t)$, is $$e_j(t) = 1 + \sum_{i=1}^{q} \left[ \frac{k_i^j}{p_i} e^{p_i t} \right] \quad (29)$$

For an exponential input of the form $$v_{in}(t) = 1 - e^{-t/\tau} \quad (30)$$

the transient response at node j is given by $$e_j(t) = 1 + e^{-t/\tau} \left[ \sum_{i=1}^{q} \frac{k_i^j \tau}{p_i \tau + 1} \right] + \sum_{i=1}^{q} \left[ \frac{k_i^j}{p_i} \frac{1}{p_i \tau + 1} e^{p_i t} \right] \quad (31)$$

where τ is the time constant of the input signal. Some of the poles determined using the present method can be unstable due to the truncation of the denominator polynomial, as will be discussed in the next section. These unstable poles can be simply discarded from the summations in equation (29) and (31). However, all the poles should be included in calculating the residues using equations (26) and (27).

E. Complexity and Stability Characteristics

The method just disclosed has a complexity linearly proportional to the order of the tree n, which is twice the number of RLC sections in the tree since each RLC section has one capacitor and one inductor. This linear complexity results because the method traverses each node in the tree only once as illustrated above. At each node of the RLC tree, polynomial multiplication is required to calculate the common denominator as given by equation (16), (21) and (17). Although polynomial multiplication has an apparent complexity proportional to $q^2$ for a $q^{th}$ order approximation, the average number of scalar multiplications required per node for a polynomial multiplication is much lower than $q^2$ for any RLC tree. To explain this argument, consider the following cases. A node of an RLC tree with the right sub-tree nonexistent has $M_r=0$ and $D_r=1$. Thus, equations (16), (21) and (17) transform into $$N_1(s)=D_l(s) \tag{32}$$

$$M_1=C_1N_1(s)+M_l(s) \tag{33}$$

$$D(s)=N_1(s)+(sR_1+s^2L_1)M_1 \tag{34}$$

respectively. Note that there is no polynomial multiplication at a node of a tree driving only one branch. The present method is therefore specifically efficient for single lines and in the cases where branches of a tree are subdivided into several series RLC sections to model the distributed nature of the interconnect impedance.

A binary tree (such as the one shown in FIG. 7) with a total of r branches has r/2 leaves. These r/2 leaves are driven by r/4 branches, which in turn are driven by r/8 branches and so on. Determining N(s), M(s), and D(s) at the r/2 leaves requires only two scalar multiplications independent of the approximation order sought since for leaf i, $N(s)=1$, $M(s)=C_i$, and $D(s)=1+R_iC_is+L_iC_is^2$. Using these values in the next level with the r/4 branches, the number of scalar multiplications needed to find N(s), M(s), and D(s) is ten multiplications for a fourth order approximation or higher. Thus, for a binary tree, the average number of scalar multiplications required by the present method is much less than $q^2$ multiplications per polynomial multiplication. For example, calculating a fourth order approximation at all the nodes of a binary tree requires a total number of scalar multiplications, SM, given by $$SM_4 = 2 \cdot \frac{r}{2} + 10 \cdot \frac{r}{4} + 25 \cdot \frac{r}{4} = 9.75r \tag{35}$$

Thus, the average number of scalar multiplications per branch of the tree is 9.75. The number of scalar multiplications calculated based on the $q^2$ polynomial multiplication complexity is 62r which is a huge overestimation. The overestimation is even worse for higher values of q. For q=60, the actual number of scalar multiplications is 160r multiplications, while the $q^2$ model would predict 1000r multiplications. As the branching factor of an RLC tree increases, the overestimation by the $q_2$ model increases. This trend results because the leaves of the tree (which requires only two scalar multiplications) constitute a larger fraction of the total number of the branches in the tree as the branching factor increases. For example, a tree with a branching factor of ten has almost 9/10 of its branches as leaves. For a general tree with a random branching factor at each node, the average number of scalar multiplications per node is much less than the $q^2$ model.

The above analysis shows that the complexity of calculating the transfer functions at all the nodes of an RLC tree is almost linear with the order of approximation sought, q. This feature makes the expense of calculating higher order approximations minimal. Also, the method depends on simple polynomial multiplications, which are numerically accurate for very high orders of approximation.

An analysis of the stability of the approximations calculated using the present method shows that an approximation with an order less than five is guaranteed to be stable.

Assume that the exact common denominator of an RLC tree is given by $$D(s)=1+b_1s+b_2s^2+\ldots+b_ns^n \tag{36}$$

The common denominator of a $q^{th}$ order approximation is therefore given by $$D_q(s)=1+b_1s+b_2s^2+\ldots+b_qs^q \tag{37}$$

For a second order approximation, the condition for stability is that $b_1$ and $b_2$ are positive. Since $b_1$ and $b_2$ are the coefficients of s and $s^2$ in the exact common denominator D(s), $b_1$ and $b_2$ are guaranteed to be positive, because a passive RLC tree is guaranteed to be stable and stability requires that all the coefficients of s in the denominator be positive. Therefore, a second order approximation is always stable. For a third order approximation, the Routh-Hurwitz criterion for stability requires that $b_1b_2>b_3$. The coefficients $b_1$, $b_2$ and $b_3$ are given by $$b_1 = \sum_{i=1}^{n} \frac{1}{p_i} \tag{38}$$

$$b_2 = \sum_{j=1}^{n} \sum_{k=j+1}^{n} \frac{1}{p_jp_k} \tag{39}$$

$$b_3 = -\sum_{i=1}^{n} \sum_{j=i+1}^{n} \sum_{k=j+1}^{n} \frac{1}{p_ip_jp_k} \tag{40}$$

respectively, where $p_1, p_2, \ldots, p_n$ are the poles of the exact common denominator and have negative real parts due to the stability of a passive RLC circuit. Thus, the quantity $b_1b_2-b_3$ is given by $$b_1b_2 - b_3 = -\sum_{i=1}^{n}\sum_{j=1}^{n}\sum_{k=j+1}^{n} \frac{1}{p_ip_jp_k} + \sum_{i=1}^{n}\sum_{j=i+1}^{n}\sum_{k=j+1}^{n} \frac{1}{p_ip_jp_k} = \tag{41}$$

$$-\sum_{i=1}^{n}\sum_{j=1}^{i}\sum_{k=j+1}^{n} \frac{1}{p_ip_jp_k}$$

Note that the quantity $b_1b_2-b_3$ is positive since $p_1, p_2, \ldots, p_n$ have negative real parts. Thus, a third order approximation is also guaranteed to be stable. The same procedure can be repeated for a fourth order system, and it can be shown that stability is also guaranteed for a fourth order system. These low order approximations are useful for RC trees since the signals within an RC tree can typically be approximated by few dominant poles due to the monotone nature of the responses. Approximations of order five or higher are not guaranteed to be stable. However, since the present method is numerically stable for any order of approximation and since its computational complexity increases slowly with the approximation order, high order approximations can always be determined using the present method to correctly detect all the poles in the frequency range of interest.

F. Experimental Results

Figure 9:
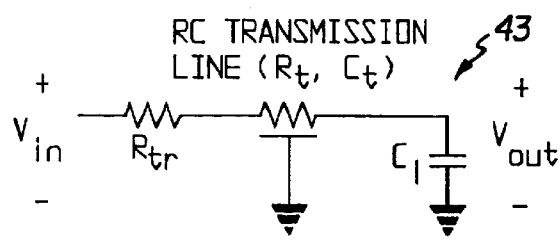
FIG. 9 shows an RC transmission line with a source resistance and a load capacitance.
Figure 10A:
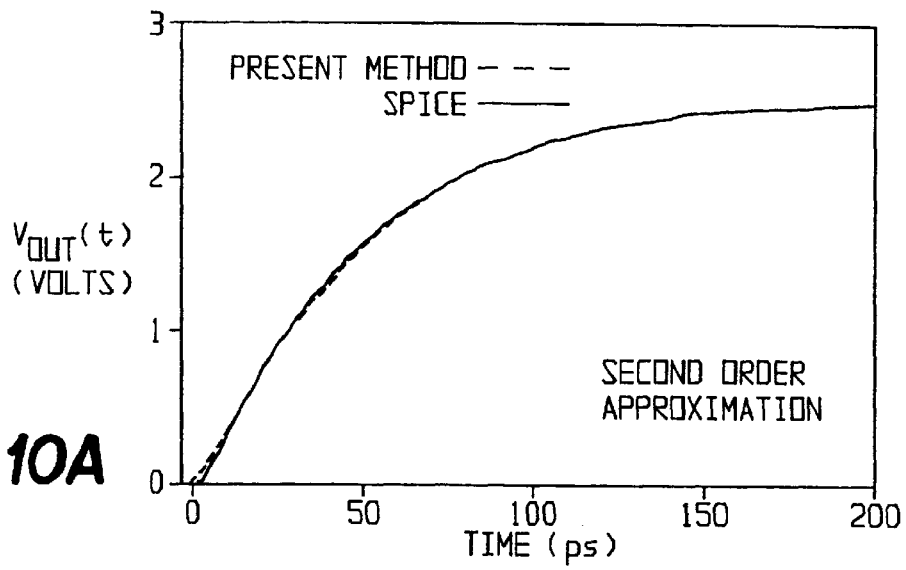
FIGS. 10A–10C show the transient response evaluated for the transmission line of FIG. 9 using different approximation orders.
Figure 10B:
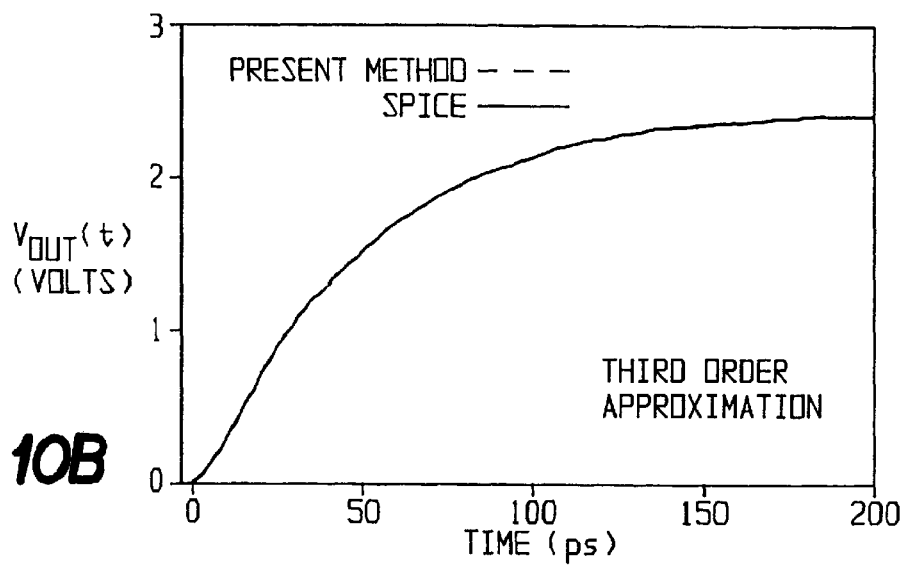
Figure 10C:
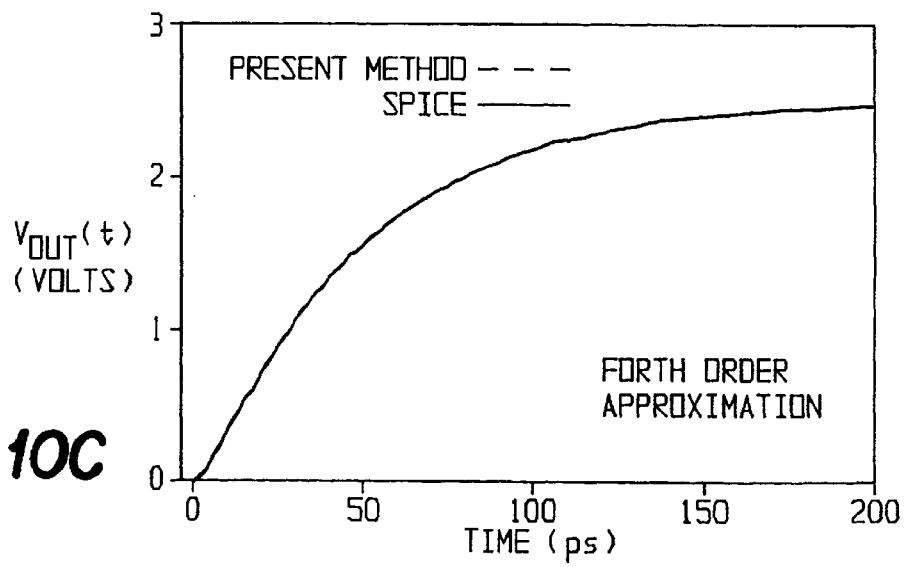

The present method will now be applied to calculate the transient response of several RC and RLC trees. The resulting transient responses are compared to SPICE simulations to evaluate the accuracy of the present method. The present method is used first to evaluate the transient response of the RC circuit 43 in FIG. 9 which represents a distributed RC transmission line driven by a lumped resistance $R_{tr}$ representing the driving gate with a load capacitance $C_L$ representing the input capacitance of the driven gate. The line has a total resistance of $R_t$ and a total capacitance of $C_t$. The transient response calculated based on the previous method with approximation orders of two, three and four are compared to the known SPICE technique in FIGS. 10A–10C, which show the results of the present method and of SPICE with dashed curves and solid curves, respectively. Note that a second order approximation has a minor error in the transient response as compared to SPICE and that the third and fourth order approximations are practically exact.

Figure 11:
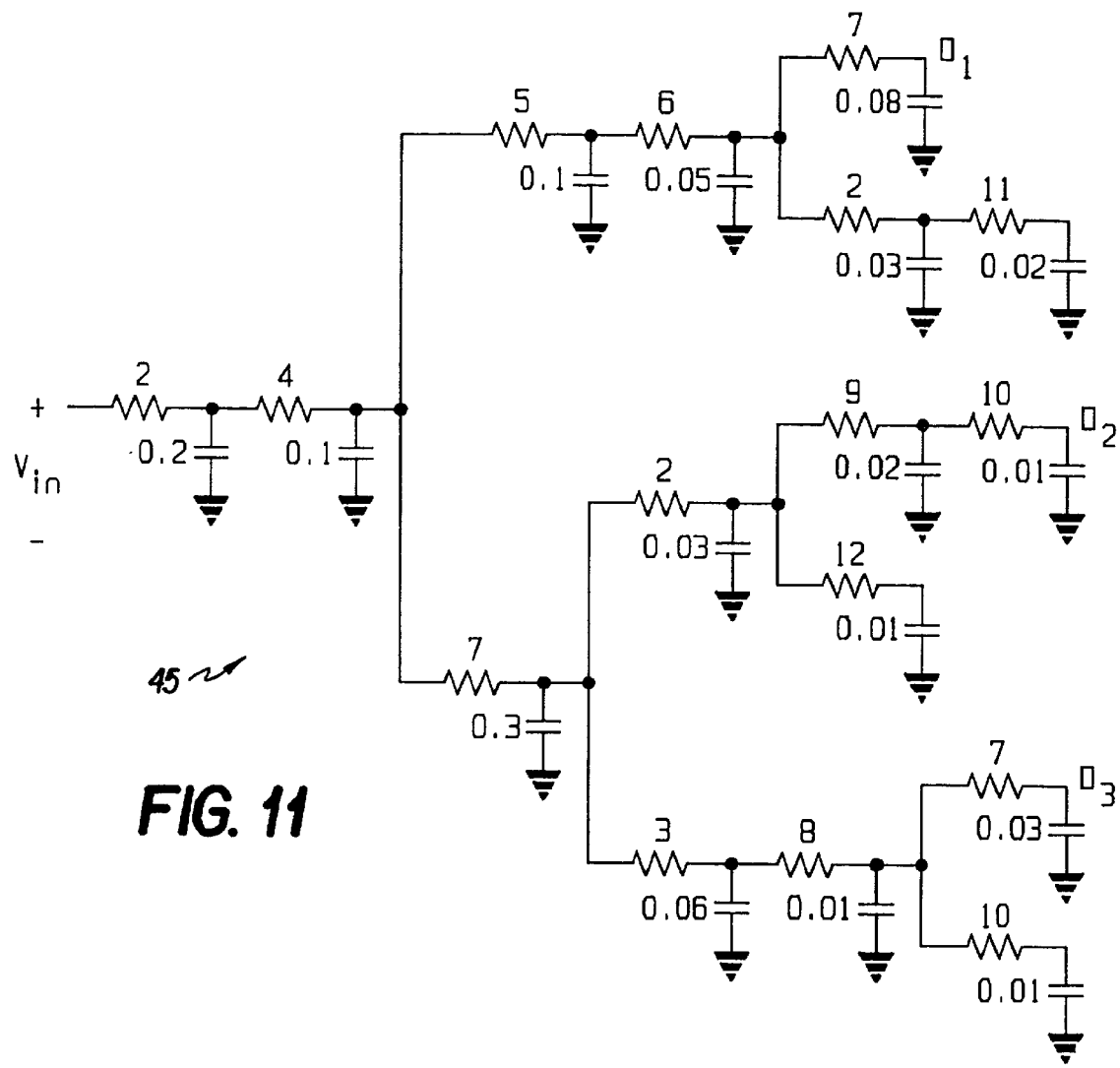
FIG. 11 shows a general RC tree.

FIG. 11 shows another circuit 45 simulated by the present method. In FIG. 11, resistance values are in ohms, inductance values are in nH and capacitance values are in pF. The transient response at several nodes of the tree are calculated based on the present method and compared to SPICE in FIGS. 12A–12D, which also show the results of the present method and of SPICE with dashed curves and solid curves, respectively. A fourth order approximation was used to calculated the transient responses in FIGS. 12A–12D. Note that a fourth order approximation is accurate as compared to SPICE simulations. In general, a fourth order approximation is sufficiently accurate for most RC trees. The guaranteed stability of a fourth order approximation is therefore a valuable feature for RC circuits. Note that despite the fact that an RC circuit cannot produce complex poles, a reduced order approximation based on the present method can result in complex poles for an RC circuit. However, the resulting complex poles for RC circuits always produce monotone responses.

Figure 13:
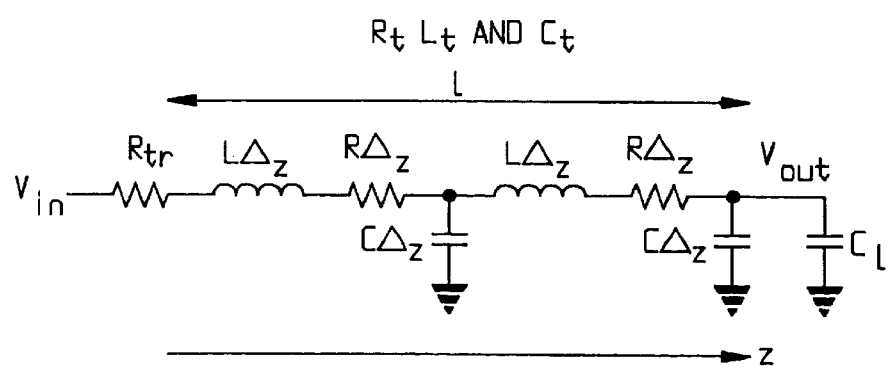
FIG. 13 shows an RLC transmission line with a source resistance and a load capacitance.
Figure 12A:
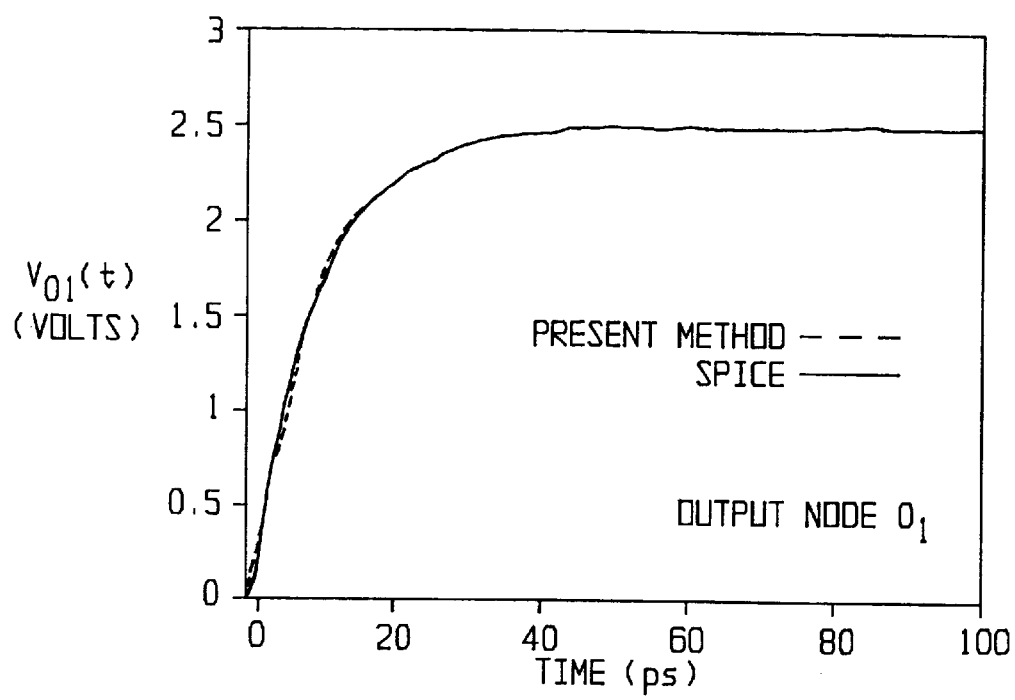
FIG. 12A–12D show the transient response evaluated at different nodes of the general RC tree of FIG. 11.
Figure 12B:
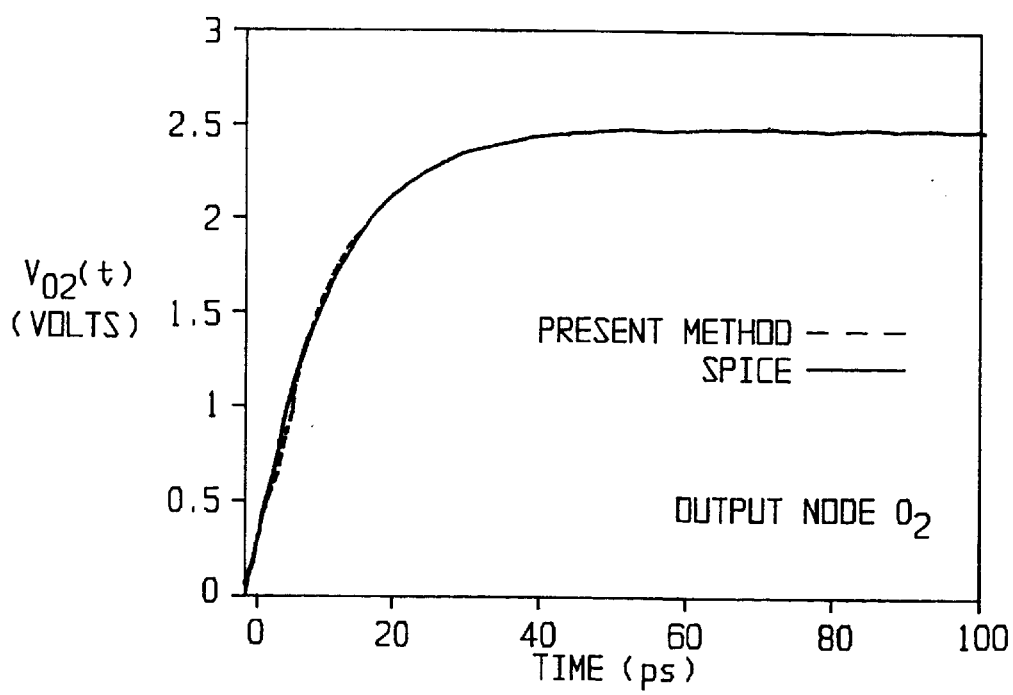
Figure 12C:
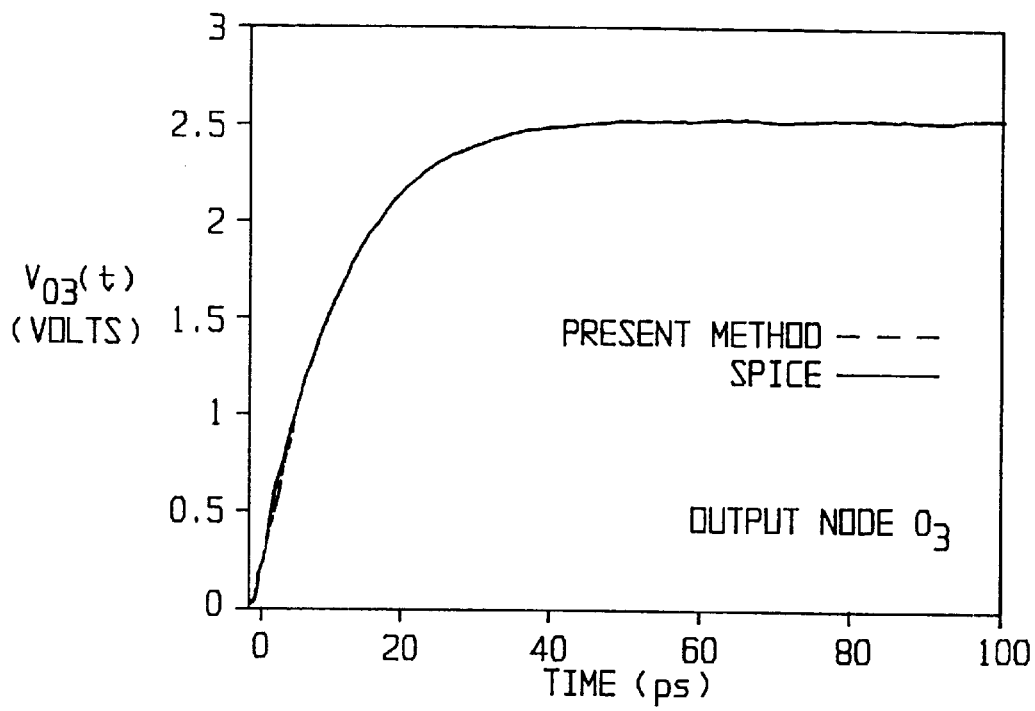
Figure 12D:
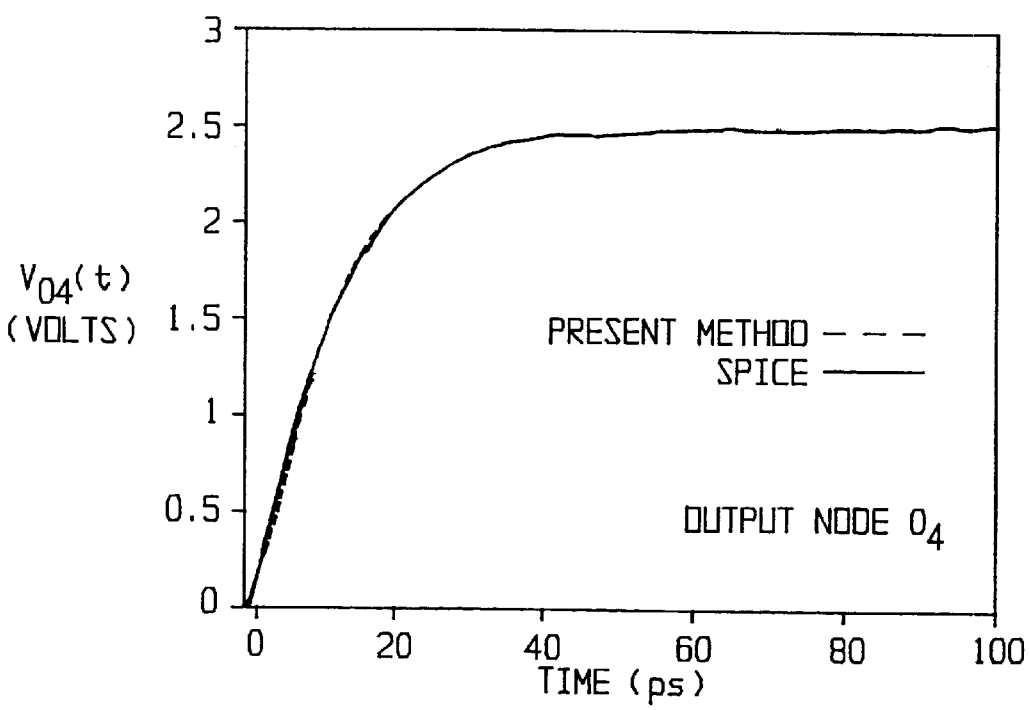
Figure 14A:
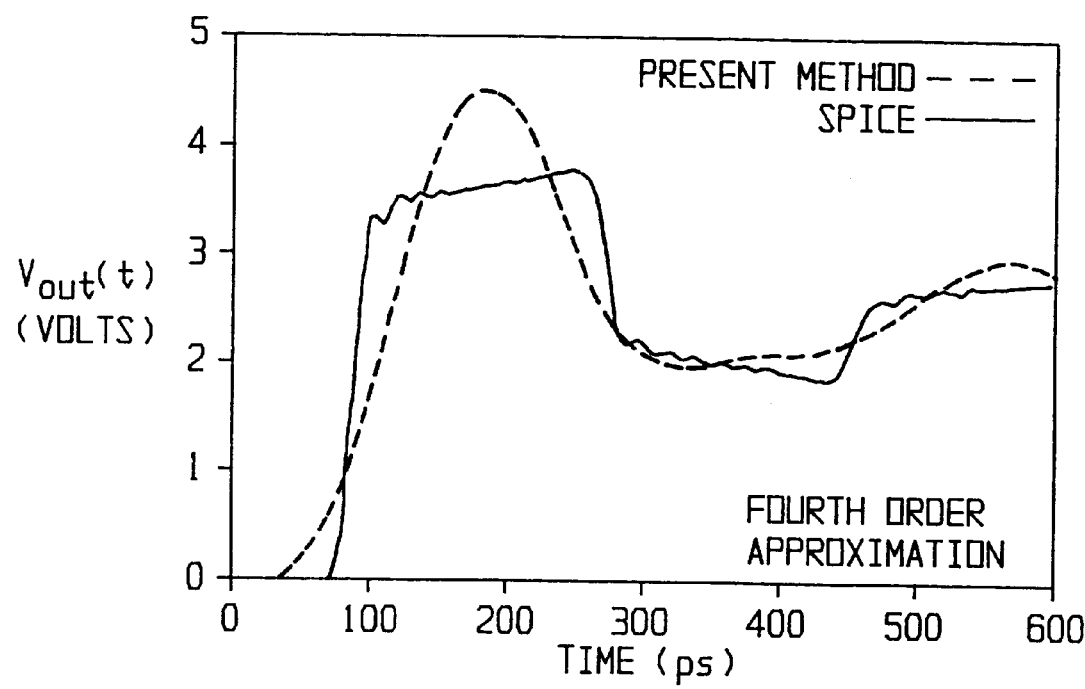
FIGS. 14A–14D show the transient response evaluated for the RLC transmission line of FIG. 13 using four different orders of approximation.
Figure 14B:
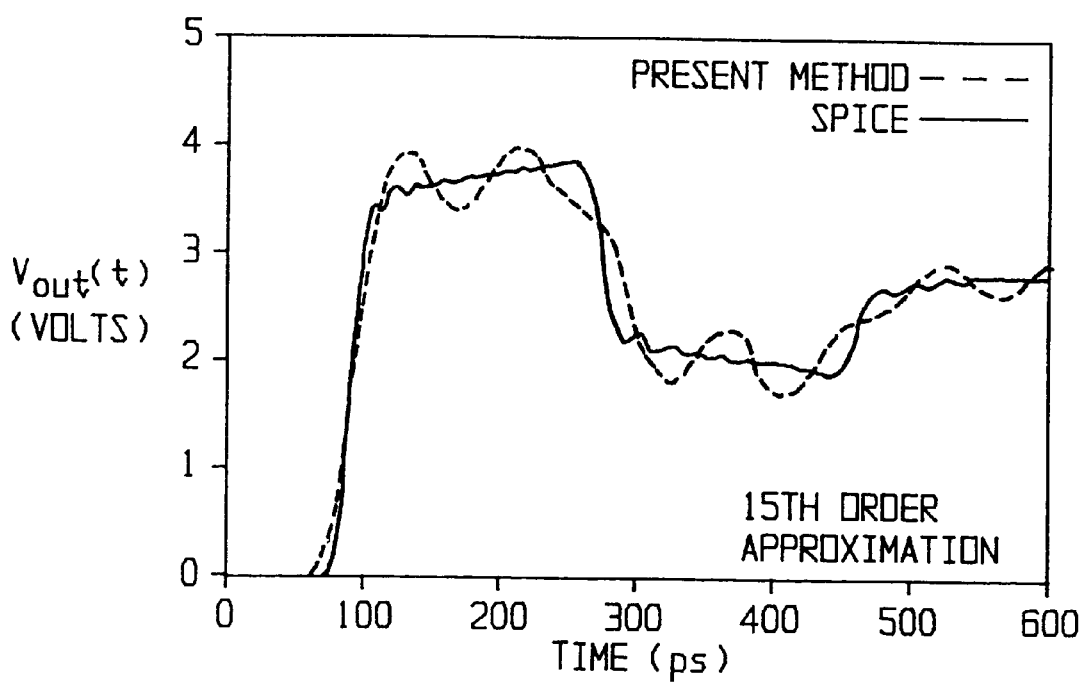
Figure 14C:
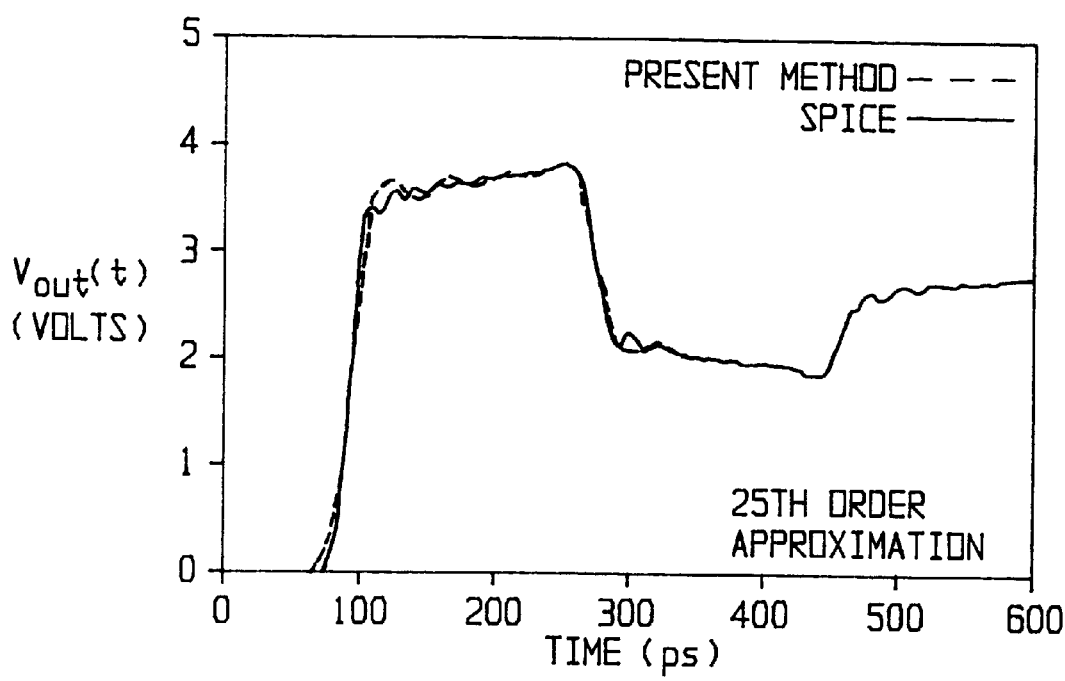
Figure 14D:
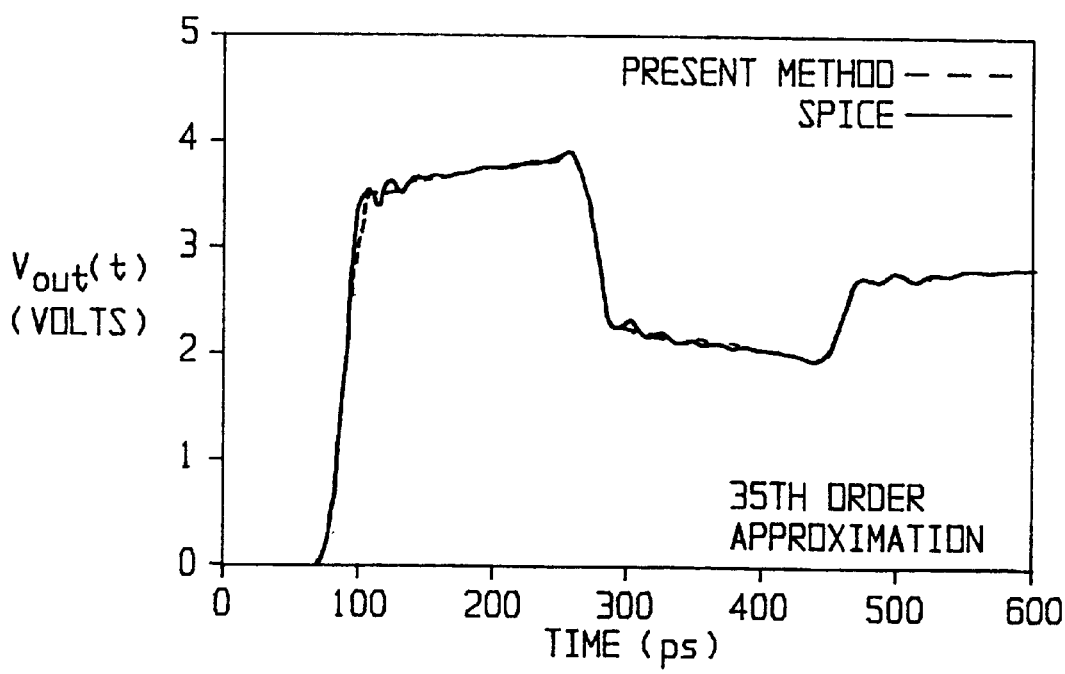
Figure 15A:
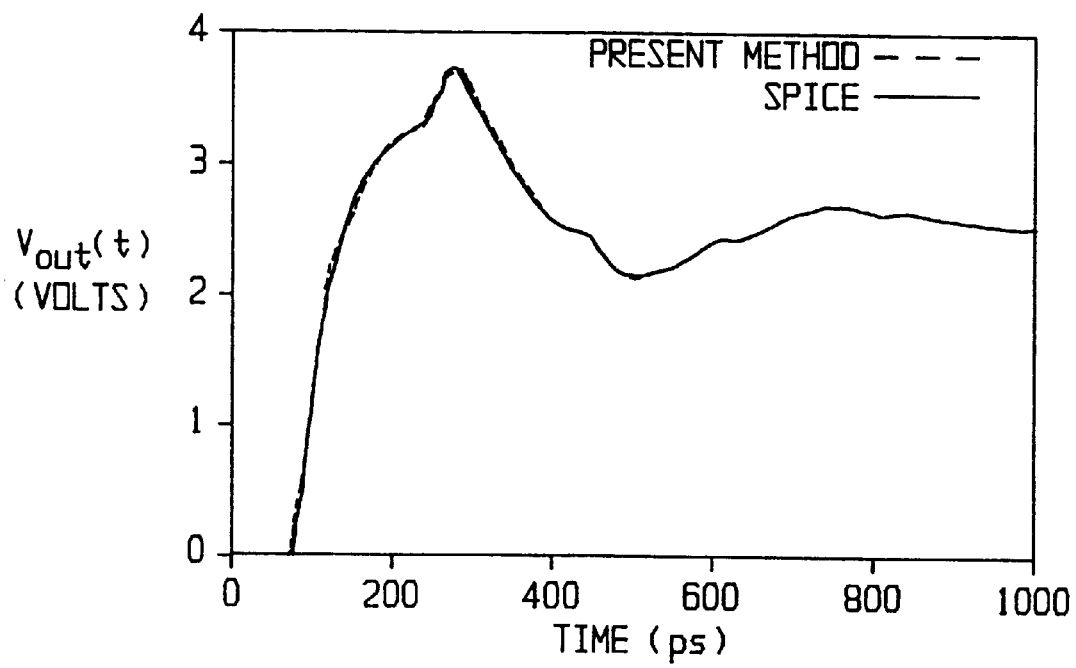
FIGS. 15A and 15B show the transient response evaluated for the RLC transmission line of FIG. 13 using different line parameters.
Figure 15B:
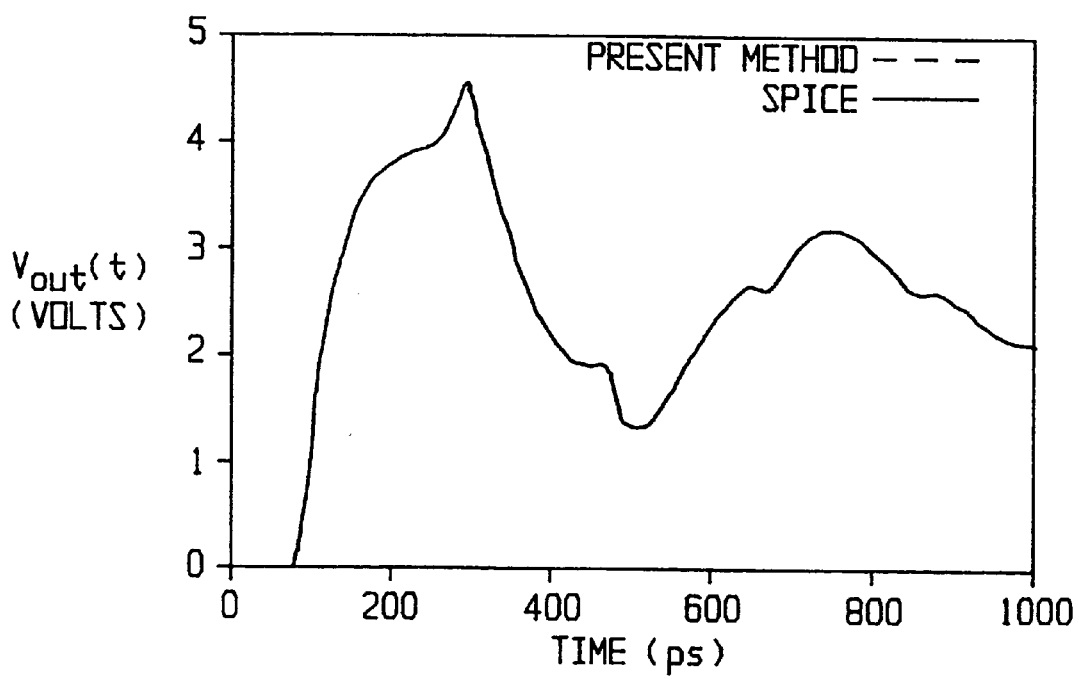
Figure 16A:
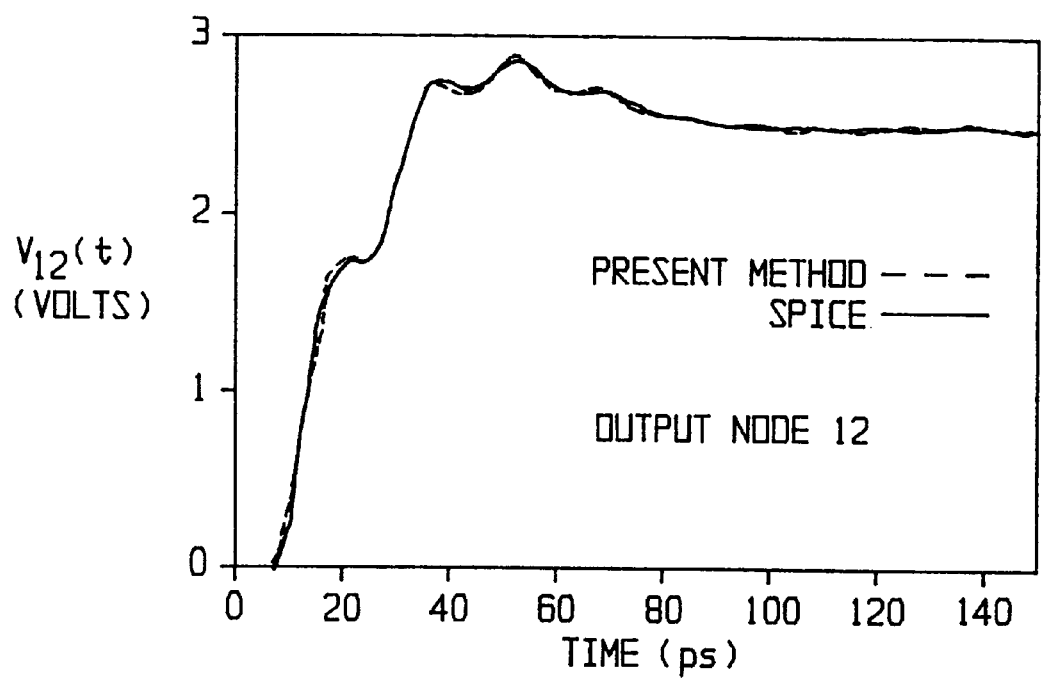
FIGS. 16A–16D show the transient response evaluated at different nodes of an RLC tree for a $40^{th}$ approximation order.
Figure 16B:
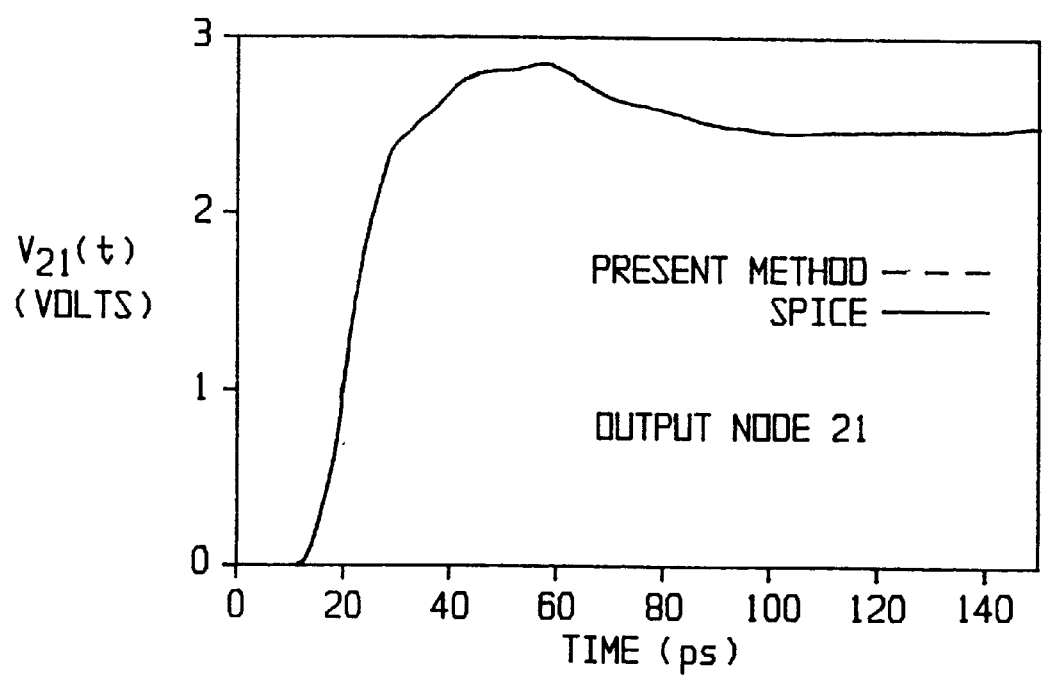
Figure 16C:
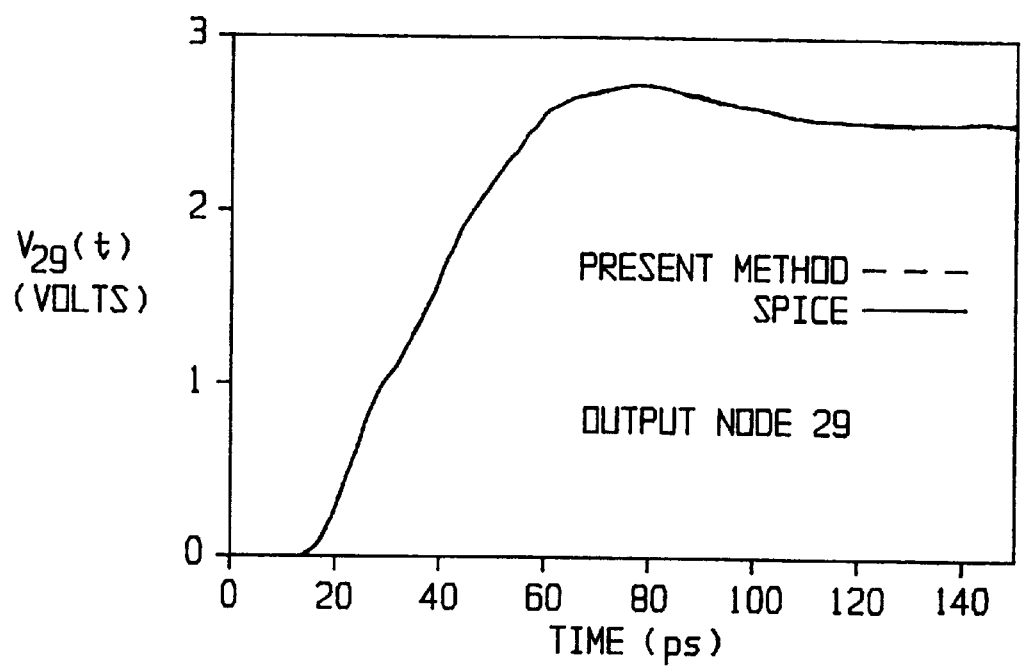
Figure 16D:
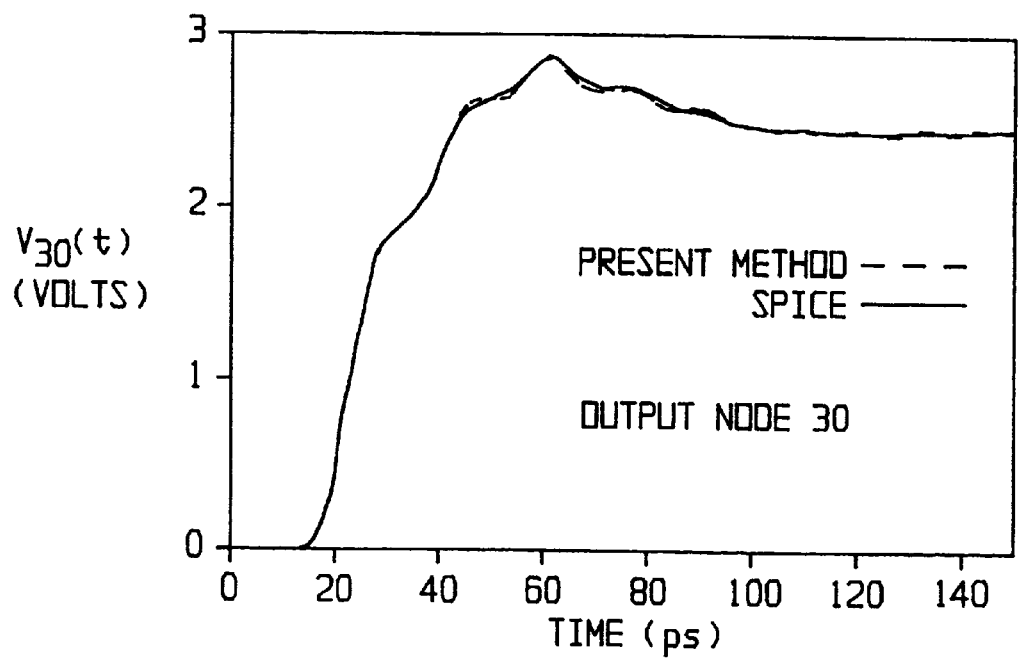

The circuit in FIG. 13 representing an RLC transmission line with a lumped resistance and a load capacitance is simulated using the present method. The transient response calculated based on the present method with approximation orders of 4, 15, 25, and 35 are compared to SPICE in FIGS. 14A–14D, which show the results of the present method and of SPICE with dashed curves and solid curves, respectively. Note that an approximation order between 25 and 35 is required for an underdamped response with a second order oscillations to achieve a SPICE-like accuracy. Such higher order approximations cannot be achieved by AWE due to its numerical instability with high approximation orders. Other methods capable of calculating such high order approximations have a much higher computational complexity as compared to the present method. The computational efficiency of the present method and its numerical accuracy for very high orders of approximation makes it suitable for simulating RLC trees. Several simulations of the circuit in FIG. 13 are shown in FIGS. 15A–15B with different line parameters and source and load impedances. In FIG. 15A, $R_t$=30 Ω, $L_t$=7 nH, $C_t$=1 pF, $R_{tr}$=20 Ω, $C_L$=0.5 pF, and approximation order=20. In FIG. 15B, $R_t$=20 Ω, $L_t$=8 nH, $C_t$=1 pF, $R_{tr}$=10 Ω, $C_L$=0.4 pF, and approximation order=25. FIGS. 15A and 15B show the results of the present method and of SPICE with dashed curves and solid curves, respectively A general RLC tree as defined in Table I below will now be considered. The tree has several RLC sections, each of which comprises a row of the table and has an ID number. The ID numbers of the left and right RLC sections driven by an RLC section are given in the fifth and sixth columns. A zero in these columns means that the left or right sections are non-existent.

TABLE I

| RLC Section number | R (Ω) | L (nH) | C (pF) | Left Section number | Right Section number |
|---|---|---|---|---|---|
| 1 | 2 | 0.07 | 0.2 | 2 | 0 |
| 2 | 4 | 0.06 | 0.1 | 4 | 3 |
| 3 | 7 | 0.04 | 0.3 | 6 | 7 |
| 4 | 5 | 0.05 | 0.1 | 5 | 0 |
| 5 | 6 | 0.03 | 0.05 | 12 | 11 |
| 6 | 6 | 0.06 | 0.03 | 10 | 9 |
| 7 | 3 | 0.06 | 0.06 | 8 | 0 |
| 8 | 8 | 0.04 | 0.1 | 15 | 16 |
| 9 | 12 | 0.05 | 0.01 | 0 | 0 |
| 10 | 9 | 0.04 | 0.02 | 14 | 0 |
| 11 | 2 | 0.05 | 0.03 | 13 | 0 |
| 12 | 7 | 0.03 | 0.08 | 0 | 0 |
| 13 | 11 | 0.07 | 0.02 | 20 | 0 |
| 14 | 10 | 0.03 | 0.01 | 19 | 0 |
| 15 | 7 | 0.04 | 0.03 | 17 | 18 |
| 16 | 10 | 0.02 | 0.01 | 0 | 0 |
| 17 | 12 | 0.02 | 0.01 | 0 | 0 |
| 18 | 3 | 0.04 | 0.1 | 24 | 0 |
| 19 | 15 | 0.04 | 0.02 | 22 | 23 |
| 20 | 5 | 0.06 | 0.07 | 21 | 0 |
| 21 | 5 | 0.06 | 0.07 | 0 | 0 |
| 22 | 5 | 0.05 | 0.05 | 0 | 0 |
| 23 | 8 | 0.04 | 0.03 | 27 | 26 |
| 24 | 8 | 0.05 | 0.02 | 25 | 0 |
| 25 | 8 | 0.06 | 0.02 | 30 | 0 |
| 26 | 2 | 0.04 | 0.02 | 0 | 0 |
| 27 | 7 | 0.03 | 0.04 | 28 | 29 |
| 28 | 16 | 0.02 | 0.06 | 0 | 0 |
| 29 | 5 | 0.05 | 0.06 | 0 | 0 |
| 30 | 8 | 0.04 | 0.02 | 0 | 0 |

The transient response at several nodes of the RLC tree depicted in Table I are evaluated based on the present method and compared to SPICE in FIGS. 16A–16D, which show the results of the present method and of SPICE with dashed curves and solid curves, respectively. A $40^{th}$ order approximation is used and is highly accurate compared to SPICE. Finally, a $45^{th}$ order approximation is used to evaluate the transient response of a large copper interconnect tree from a 0.25 μm CMOS IBM technology. The tree has 673 capacitors and 673 inductors. The transient responses based on the method and SPICE are compared in FIG. 17, which also shows the results of the present method and of SPICE with dashed curves and solid curves, respectively. Note that the present method is capable of accurately characterizing the transient response of large industrial RLC trees with underdamped responses.

The implementation of the preferred embodiment on a computing device will now be disclosed.

A general RLC tree is composed of several RLC sections connected together. Each RLC section has a series resistance, inductance, and capacitance with the capacitance grounded as shown in FIG. 2. It is required to calculate the transfer functions across all the capacitors in the RLC tree. The function to calculate the common denominator of an RLC tree rooted at the RLC section w is Cal_Denominator and uses the algorithm explained above. The pseudo-code that performs this task is shown in FIG. 18.

The function is initially called by Cal_Denominator($w_1$) and recursively calculates the common denominator. The structure "section" has the elements R, L, and C, which represent the resistance, inductance, and capacitance of an RLC section, respectively. The structure also has the arrays N, M and D, which represent the polynomials of the numerator, M in equation (21) and the denominator of the transfer function across the capacitor of the RLC section, respectively. The operation "·" represents polynomial multiplication. An efficient limited order polynomial multiplication function should be used as discussed above. The functions, left(w) and right(w), return pointers to the left and right sections driven by w, respectively. If no left (right) section is driven by w, left(w)=0(right(w)=0). The function uses equations (16), (21) and (17) and the recursion termination conditions described by the method in subsection B above.

The second step is to correct the numerators of the transfer functions at the nodes of the RLC tree. The function performing this task is described in FIG. 19. The function is initially called the Correct-Numerators($w_I$,1) and recursively corrects the numerators at all the nodes of the RLC tree as described in subsection B of section II. Note that the Correct_Numerators function has to be called after the Cal_Denominator function has been called.

The preferred embodiment can be implemented on any computing device capable of running code based on the pseudo-code of FIGS. 18 and 19. Like known circuit analysis software such as SPICE, the preferred embodiment can be written in a suitable computer language such as Fortran or C++ and ported to Unix, Linux, or MS Windows 95/98/NT.

Figure 21:
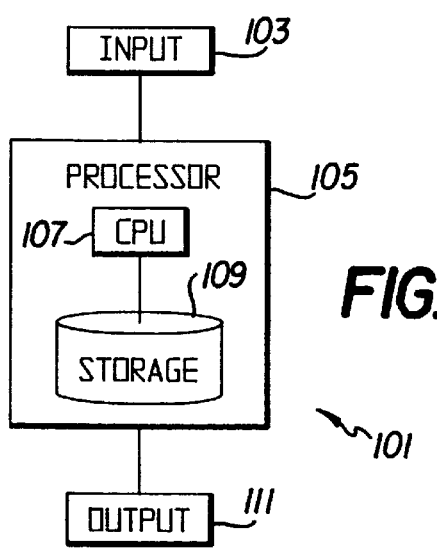
FIG. 21 shows a block diagram of a computing system on which the preferred embodiment can be implemented.

A block diagram of a suitable computing device 101 is shown in FIG. 21. An input 103 allows the user to input the circuit configuration in any manner such as those known in the art of computer-implemented circuit analysis and can include one or more of a keyboard, a mouse, a digitizing tablet, and the like. A processor 105 includes a CPU 107 (such as a microprocessor chip) and persistent storage 109 for storing the operating system, the software to implement the circuit analysis, and various circuit configurations to be analyzed. An output 111 provides the user with the results of the analysis and can include one or more of a display, a printer, and the like. Other components to be included are well known to those skilled in the art and will therefore not be listed here.

While a preferred embodiment of the present invention has been set forth above, those skilled in the art who have reviewed the present disclosure will readily appreciate that other embodiments can be realized within the scope of the invention. For example, while certain mathematical techniques have been disclosed, the same decomposition into right and left sub-trees and recursive analysis can be implemented through different mathematical techniques. Therefore, the present invention should be construed as limited only by the appended claims.

We claim:

1. A method of calculating transfer functions within an RLC tree, the RLC tree having an input and a plurality of nodes, the method comprising:
    (a) dividing the RLC tree into left and right sub-trees joined by one of said nodes closest to the input;
    (b) dividing each of the left and right sub-trees into left and right sub-trees joined by one of said nodes;
    (c) performing step (b) recursively until the RLC tree is completely decomposed into left and right sub-trees joined by said nodes; and
    (d) determining the transfer functions in accordance with the left and right sub-trees determined in step (c).
2. The method of claim 1, wherein step (d) comprises:
    (i) at each of said nodes of the RLC tree, determining a numerator and a denominator of the transfer function at that node in accordance with the left and right sub-trees joined by that node;
    (ii) taking a denominator of a transfer function of the node closest to the input to be the denominator of all of the transfer functions of the RLC tree; and
    (iii) for each of said nodes, correcting the numerators of the transfer functions of the left and right sub-trees joined at that node in accordance with the denominators determined in step (d)(i) of the transfer functions of the right and left sub-trees joined at that node, respectively.
3. The method of claim 2, wherein said transfer functions are calculated such that a transfer function for all of said RLC tree has poles which are equal to zeros of a transfer function at one of said nodes at which said RLC tree is driven.
4. The method of claim 2, wherein said transfer functions are calculated such that a transfer function for all of said RLC tree has poles which are equal to zeros of transfer functions at all nodes of parallel subcircuits within said RLC tree which are driven at a same node at which said RLC tree is driven.
5. The method of claim 2, wherein step (d)(iii) is performed after steps (a)–(c) and (d)(i)–(d)(ii).
6. The method of claim 5, wherein step (d)(iii) comprises:
    (A) at the node closest to the input, multiplying all of the numerators in the left sub-tree by the denominator in the right sub-tree and multiplying all of the numerators in the right sub-tree by the denominator in the left sub-tree;
    (B) for each of the left and right sub-trees, performing step (d)(iii)(A) on the left and right sub-trees into which that sub-tree is divided; and
    (C) performing step (d)(iii)(B) recursively until step (d)(iii)(B) has been performed for all of the nodes of the RLC tree.
7. The method of claim 2, wherein:
    the RLC tree has a total number of capacitors and inductors equal to a quantity n;
    the transfer functions are calculated in a low-frequency approximation by calculating the transfer functions to an order q which is lower than n.
8. The method of claim 7, wherein:
    each node is associated with a number m which is equal to the order of the numerator of an exact value of the transfer function at that node; and
    in the low-frequency approximation, the numerator at each node is calculated to:
        an order equal to m if m≤q-1; or
        an order equal to q-1 otherwise.
9. The method of claim 7, in which step (d)(iii) is done through an order-limited multiplication in which all terms of order higher than q are discarded.
10. The method of claim 7, wherein:
    the denominator taken in step (d)(ii) is a polynomial $D_q$ of order q;
    the polynomial $D_q$ has roots which are taken to be dominant low-order poles of the RLC tree; and
    step (d)(iii) comprises:
        (A) finding the poles;
        (B) calculating residues of each pole at each node; and
        (C) at each node, deriving an expression of the transfer function at the node in terms of the residues of the poles at the node.
11. The method of claim 10, further comprising (e) using the expression of the transfer function derived in step (d)(iii)(C) to calculate a transient response at each node for an input signal applied to the input of the RLC tree.

12. The method of claim 10, wherein step (e) comprises:
(i) taking a Laplace transform of the input signal;
(ii) multiplying the Laplace transform of the input signal by the expression of the transfer function derived in step (d)(iii)(C) to form a product; and
(iii) taking an inverse Laplace transform of the product formed in step (e)(ii).

13. The method of claim 12, wherein the expression of the transfer function is derived independently of the input signal.

14. The method of claim 2, wherein:
the RLC tree comprises a non-binary branch; and
the non-binary branch is converted into a binary branch by insertion of at least one zero-impedance branch.

15. A system for calculating transfer functions within an RLC tree, the RLC tree having an input and a plurality of nodes, the system comprising:
input means for receiving an input representing a configuration of the RLC tree;
processing means for receiving the input received by the input means and for:
(a) dividing the RLC tree into left and right sub-trees joined by one of said nodes closest to the input;
(b) dividing each of the left and right sub-trees into left and right sub-trees joined by one of said nodes;
(c) performing step (b) recursively until the RLC tree is completely decomposed into left and right sub-trees joined by said nodes; and
(d) determining the transfer functions in accordance with the left and right sub-trees determined in step (c); and
output means for outputting a result of steps (a)–(d).

16. The system of claim 15, wherein the processing means performs step (d) by:
(i) at each of said nodes of the RLC tree, determining a numerator and a denominator of the transfer function at that node in accordance with the left and right sub-trees joined by that node;
(ii) taking a denominator of a transfer function of the node closest to the input to be the denominator of all of the transfer functions of the RLC tree; and
(iii) for each of said nodes, correcting the numerators of the transfer functions of the left and right sub-trees joined at that node in accordance with the denominators determined in step (d)(i) of the transfer functions of the right and left sub-trees joined at that node, respectively.

17. The system of claim 16, wherein said transfer functions are calculated such that a transfer function for all of said RLC tree has poles which are equal to zeros of a transfer function at one of said nodes at which said RLC tree is driven.

18. The system of claim 16, wherein said transfer functions are calculated such that a transfer function for all of said RLC tree has poles which are equal to zeros of transfer functions at all nodes of parallel subcircuits within said RLC tree which are driven at a same node at which said RLC tree is driven.

19. The system of claim 16, wherein step (d)(iii) is performed after steps (a)–(c) and (d)(i)–(d)(ii).

20. The system of claim 19, wherein step (d)(iii) comprises:

(A) at the node closest to the input, multiplying all of the numerators in the left sub-tree by the denominator in the right sub-tree and multiplying all of the numerators in the right sub-tree by the denominator in the left sub-tree;
(B) for each of the left and right sub-trees, performing step (d)(iii)(A) on the left and right sub-trees in to which that sub-tree is divided; and
(C) performing step (d)(iii)(B) recursively until step (d)(iii)(B) has been performed for all of the nodes of the RLC tree.

21. The system of claim 16, wherein:
the RLC tree has a total number of capacitors and inductors equal to a quantity n;
the transfer functions are calculated in a low-frequency approximation by calculating the transfer functions to an order q which is lower than n.

22. The system of claim 21, wherein:
each node is associated with a number m which is equal to the order of the numerator of an exact value of the transfer function at that node; and
in the low-frequency approximation, the numerator at each node is calculated to:
an order equal to m if $m \leq q1$; or an order equal to q-1 otherwise.

23. The system of claim 21, in which step (d)(iii) is done through an order-limited multiplication in which all terms of order higher than q are discarded.

24. The system of claim 21, wherein:
the denominator taken in step (d)(ii) is a polynomial $D_q$ of order q;
the polynomial $D_q$ has roots which are taken to be dominant low-order poles of the RLC tree; and
step (d)(iii) comprises:
(A) finding the poles;
(B) calculating residues of each pole at each node; and
(C) at each node, deriving an expression of the transfer function at the node in terms of the residues of the poles at the node.

25. The system of claim 23, wherein the processing means further performs step (e) of using the expression of the transfer function derived in step (d)(iii)(C) to calculate a transient response at each node for an input signal applied to the input of the RLC tree.

26. The system of claim 25, wherein step (e) comprises:
(i) taking a Laplace transform of the input signal;
(ii) multiplying the Laplace transform of the input signal by the expression of the transfer function derived in step (d)(iii)(C) to form a product; and
(iii) taking an inverse Laplace transform of the product formed in step (e)(ii).

27. The system of claim 26, wherein the expression of the transfer function is derived independently of the input signal.

28. The system of claim 16, wherein:
the RLC tree comprises a non-binary branch; and
the non-binary branch is converted into a binary branch by insertion of at least one zero-impedance branch.

* * * * *